US008885396B2

(12) United States Patent
Yamanaka et al.

(10) Patent No.: US 8,885,396 B2
(45) Date of Patent: Nov. 11, 2014

(54) MEMORY DEVICE AND METHOD FOR MANUFACTURING THE SAME

(75) Inventors: Takaya Yamanaka, Mie-ken (JP); Susumu Shuto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 13/423,973

(22) Filed: Mar. 19, 2012

(65) Prior Publication Data

US 2013/0058162 A1 Mar. 7, 2013

(30) Foreign Application Priority Data

Sep. 7, 2011 (JP) .................................. 2011-194633

(51) Int. Cl.
*G11C 11/00* (2006.01)
*H01L 43/08* (2006.01)
*H01L 27/22* (2006.01)
*G11C 11/16* (2006.01)

(52) U.S. Cl.
CPC ................ *G11C 11/16* (2013.01); *H01L 43/08* (2013.01); *H01L 27/228* (2013.01); *Y10S 977/933* (2013.01); *Y10S 977/935* (2013.01)
USPC ........... 365/158; 365/148; 365/171; 365/173; 977/933; 977/935

(58) Field of Classification Search
CPC ..................................................... G11C 11/15
USPC ......... 365/48, 55, 62, 66, 74, 78, 80–93, 100, 365/130, 131, 148, 158, 171–173, 209, 213, 365/225.5, 230.07, 232, 243.5; 977/933–935
See application file for complete search history.

(56) References Cited

U.S. PATENT DOCUMENTS

| 6,590,244 | B2 | 7/2003 | Asao et al. |
| 6,777,730 | B2 * | 8/2004 | Daughton et al. ............ 257/295 |

(Continued)

FOREIGN PATENT DOCUMENTS

| JP | 2002-359356 | 12/2002 |
| JP | 2005-108973 | 4/2005 |
| JP | 2006-523963 | 10/2006 |
| JP | 2008-091703 | 4/2008 |

(Continued)

OTHER PUBLICATIONS

Background Art Information with Concise Explanation for Japanese Foreign Reference #1, undated, in 1 page.

(Continued)

*Primary Examiner* — Harry W Byrne
(74) *Attorney, Agent, or Firm* — Knobbe, Martens, Olson & Bear LLP

(57) ABSTRACT

According to one embodiment, a memory device includes: a first signal line; a second signal line; a transistor; a memory region; and a conductive region. The transistor controls a conduction of each of a current in a first direction flowing between the first line and the second line and a current in a second direction opposite to the first direction. The memory region has a first magnetic tunnel junction element which is connected between the first line and one end of the transistor, a magnetization direction of which becomes parallel when a current not less than a first parallel threshold value flows in the first direction, and the magnetization direction of which becomes antiparallel when a current not less than a first antiparallel threshold value flows in the second direction. The conductive region is connected between the second line and the other end of the transistor.

12 Claims, 15 Drawing Sheets

(56) References Cited

U.S. PATENT DOCUMENTS

| | | |
|---|---|---|
| 6,784,510 B1 | 8/2004 | Grynkewich et al. |
| 7,141,842 B2 | 11/2006 | Kajiyama |
| 7,209,380 B2 * | 4/2007 | Ezaki et al. .......... 365/158 |
| 7,529,114 B2 | 5/2009 | Asao |
| 2003/0048676 A1 * | 3/2003 | Daughton et al. ...... 365/200 |
| 2010/0097846 A1 | 4/2010 | Sugiura et al. |
| 2010/0135068 A1 * | 6/2010 | Ikarashi et al. ........ 365/158 |
| 2013/0044537 A1 | 2/2013 | Ishigaki et al. |

FOREIGN PATENT DOCUMENTS

| | | |
|---|---|---|
| JP | 2009-94226 | 4/2009 |
| JP | 2009-151885 | 7/2009 |
| JP | 2010-103224 | 5/2010 |
| WO | WO 2011/087038 | 7/2011 |

OTHER PUBLICATIONS

Japanese Office Action, Notification of Reasons for Refusal for Japanese Application No. 2011-194633, dated Jan. 20, 2014, in 8 pages.

* cited by examiner

US 8,885,396 B2

MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-194633, filed on Sep. 7, 2011; the entire contents of which are incorporated herein by reference.

FIELD

Embodiments described herein relate generally to a memory device and a method for manufacturing the same.

BACKGROUND

A magnetoresistive random access memory (MRAM) is one of nonvolatile memories which stores information utilizing a change in the resistance of a magnetic tunnel junction (MTJ) element. The MTJ element includes a pair of ferromagnetic layers and a tunnel barrier layer provided between the pair of ferromagnetic layers. The MTJ element is an element which, according to a parallel or antiparallel state in a magnetization direction of the ferromagnetic layer, changes the resistance value with respect to a tunnel current flowing through the tunnel barrier layer. In a memory device employing such an MRAM, a furthermore simplification of manufacturing process is desired.

DETAILED DESCRIPTION

Figure 1A:
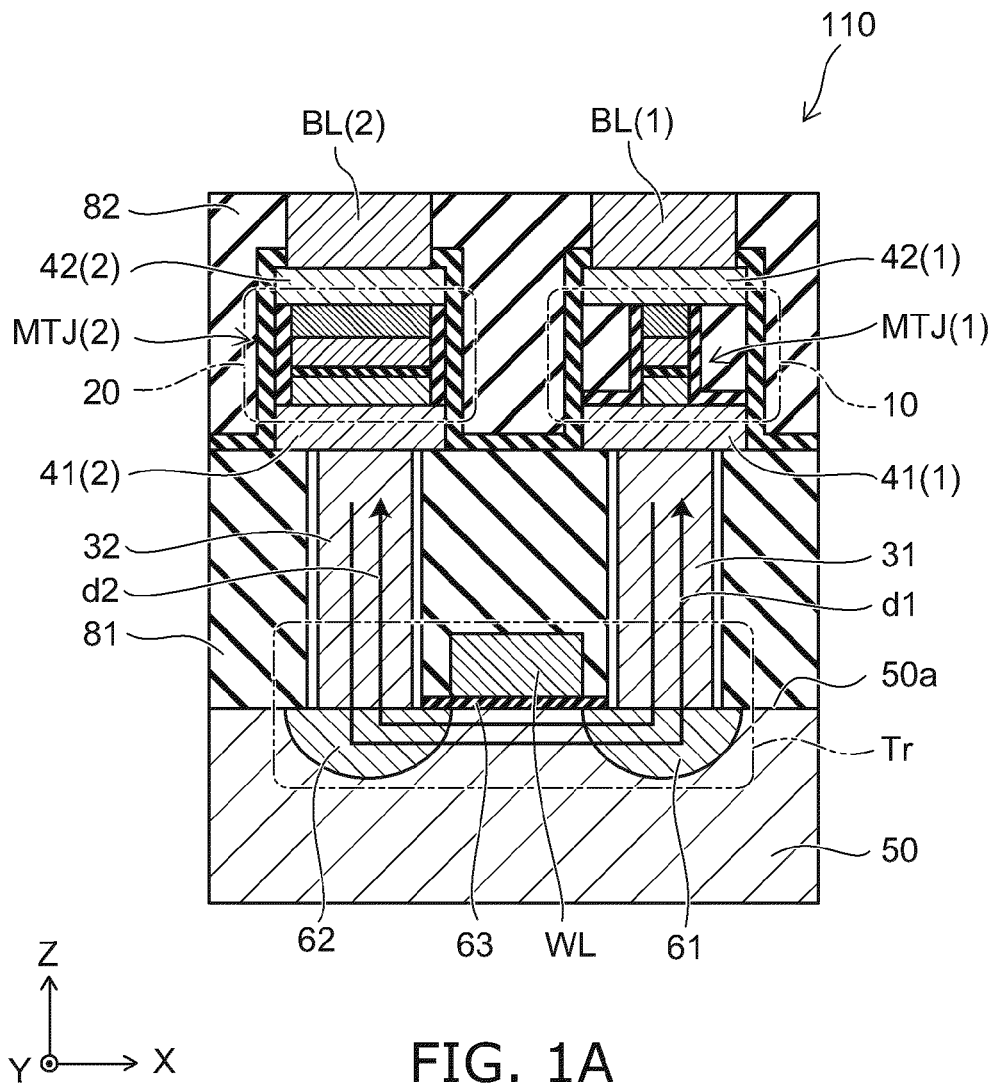
FIGS. 1A to 1C are schematic cross sectional views illustrating the configuration of a memory device according to a first embodiment.

In general, according to one embodiment, a memory device includes: a first signal line; a second signal line; a transistor; a memory region; and a conductive region. The transistor controls a conduction of each of a current in a first direction flowing between the first signal line and the second signal line and a current in a second direction opposite to the first direction. The memory region has a first magnetic tunnel junction element which is connected between the first signal line and one end of the transistor, a magnetization direction of which becomes parallel when a current not less than a first parallel threshold value flows in the first direction, and the magnetization direction of which becomes antiparallel when a current not less than a first antiparallel threshold value flows in the second direction. The conductive region is connected between the second signal line and the other end of the transistor.

In general, according to another embodiment, a method for manufacturing a memory device, includes: forming a transistor in a semiconductor substrate and covering the transistor with an insulating film; forming a first via which penetrates through the insulating film and is conductive with a source region or a drain region of the transistor, and a second via which penetrates through the insulating film and is conductive with the drain region or the source region of the transistor; forming a stacked film, wherein a lower ferromagnetic material layer, a tunnel barrier layer and an upper ferromagnetic material layer are stacked in this order on the first via and the second via; and etching the stacked film to form a memory region having a first magnetic tunnel junction element while leaving a part of the stacked film on the first via, and to form a conductive region while leaving another part of the stacked film on the second via.

In general, according to another embodiment, a method for manufacturing a memory device, includes: forming a transistor in a semiconductor substrate and covering the transistor with an insulating film; forming a first via which penetrates through the insulating film and is conductive with a source region or a drain region of the transistor, and a second via which penetrates through the insulating film and is conductive with the drain region or the source region of the transistor; forming a lower ferromagnetic material layer on the first via and the second via; forming a tunnel barrier layer on a portion of the lower ferromagnetic material layer excluding a portion on the second via, and forming an upper ferromagnetic material layer on the second via and on the tunnel barrier layer; and etching a stacked film of the lower ferromagnetic material layer, the tunnel barrier layer and the upper ferromagnetic material layer to form a memory region having a first magnetic tunnel junction element in which a part of the stacked film is left on the first via, and to form a conductive region having a stacked body in which a part of the lower ferromagnetic material layer and the upper ferromagnetic material layer are left on the second via.

Embodiments of the invention will now be described with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be shown differently among the drawings, even for identical portions.

In the specification and the drawings of the application, components similar to those described in regard to a drawing thereinabove are marked with like reference numerals, and a detailed description is omitted as appropriate.

First Embodiment

Figures 1B, 1C:
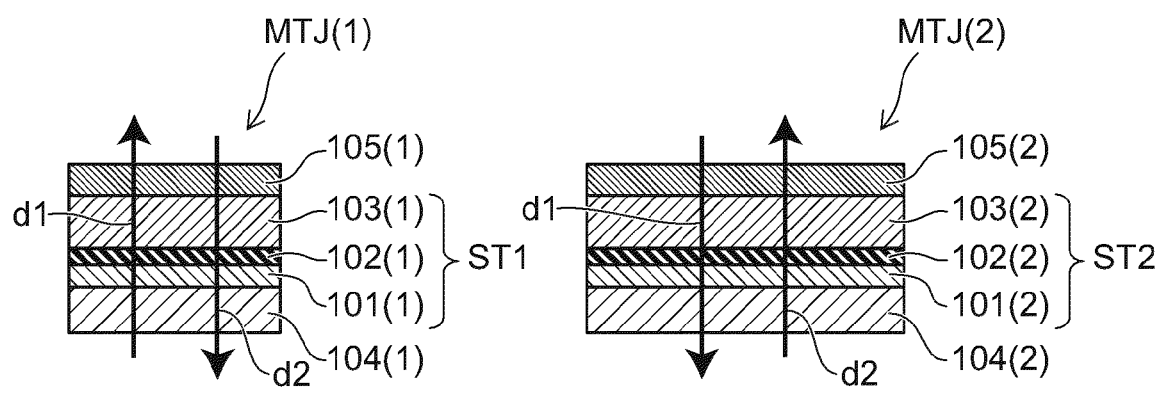

FIGS. 1A to 1C are schematic cross sectional views illustrating the configuration of a memory device according to a first embodiment.

Figure 2:
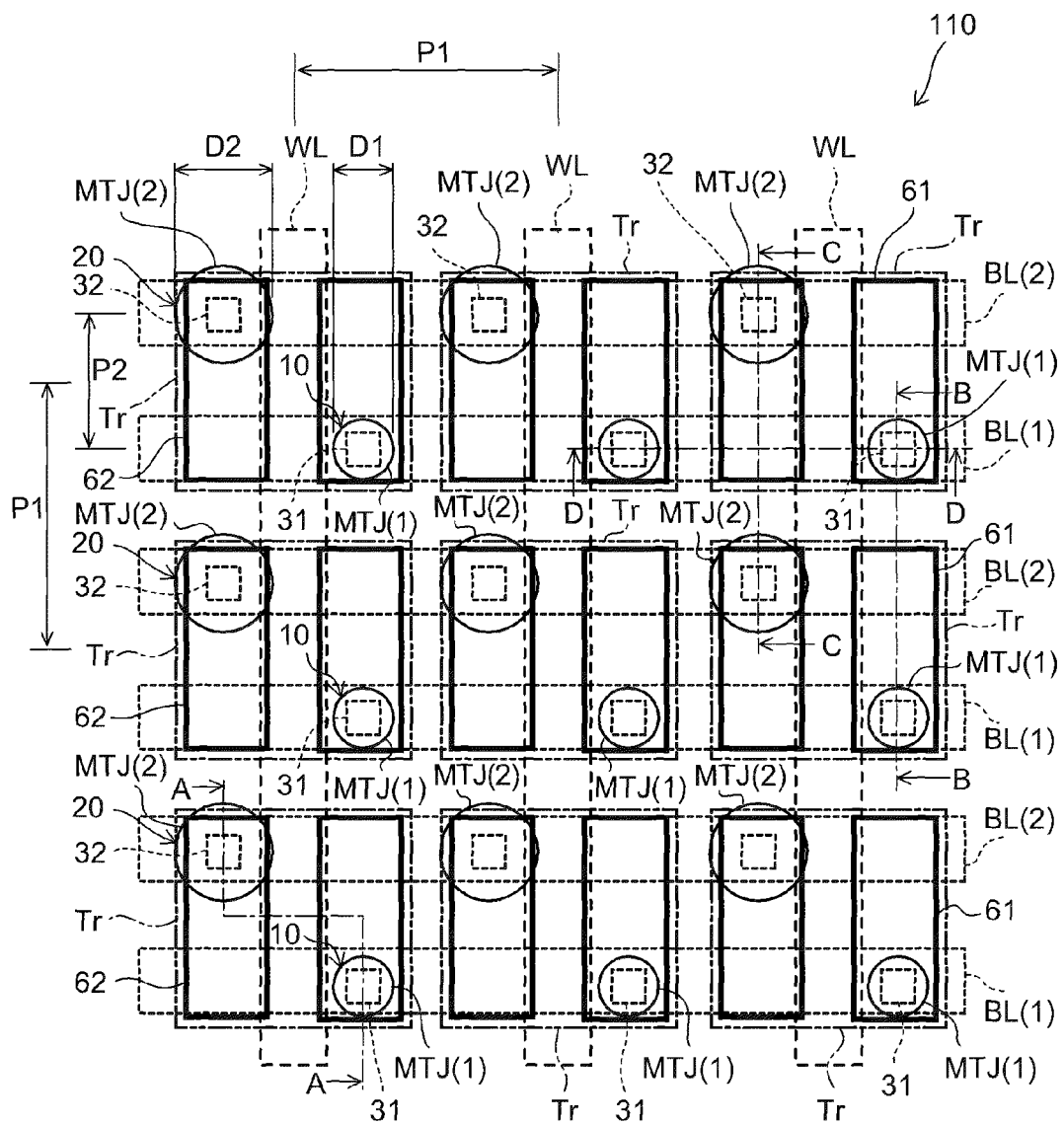
FIG. 2 is a schematic plan view illustrating the memory device according to the first embodiment.

FIG. 2 is a schematic plan view illustrating the memory device according to the first embodiment.

Figure 3A:
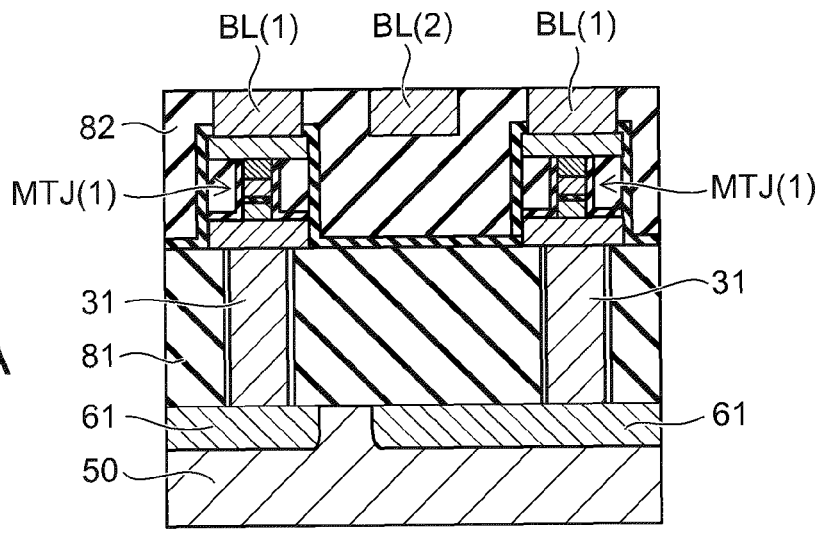
FIGS. 3A to 3C are schematic enlarged sectional views of a portion shown in FIG. 2.
Figure 3B:
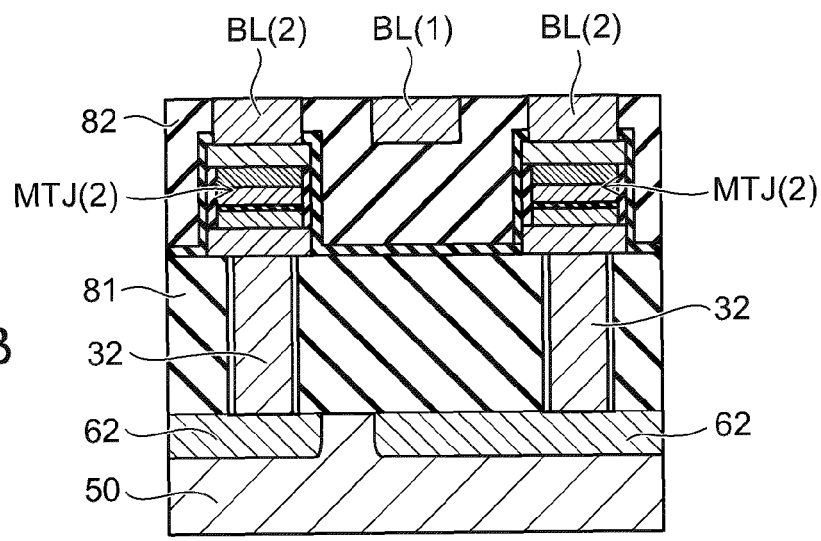
Figure 3C:
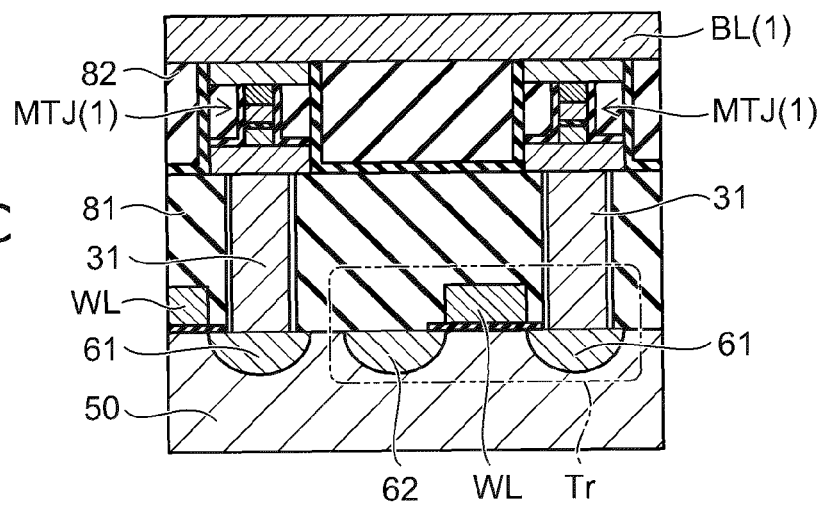

FIGS. 3A to 3C are schematic enlarged sectional views of a portion shown in FIG. 2.

Figure 4A:
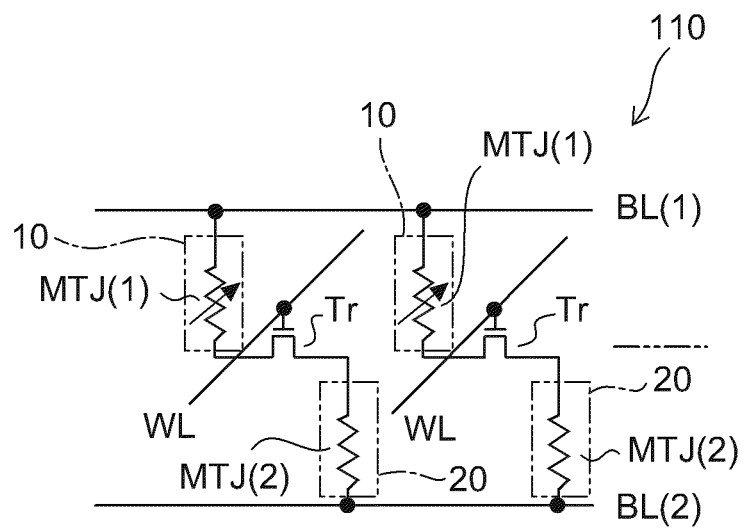
FIGS. 4A to 4B are views illustrating circuit configurations of the memory device.
Figure 4B:
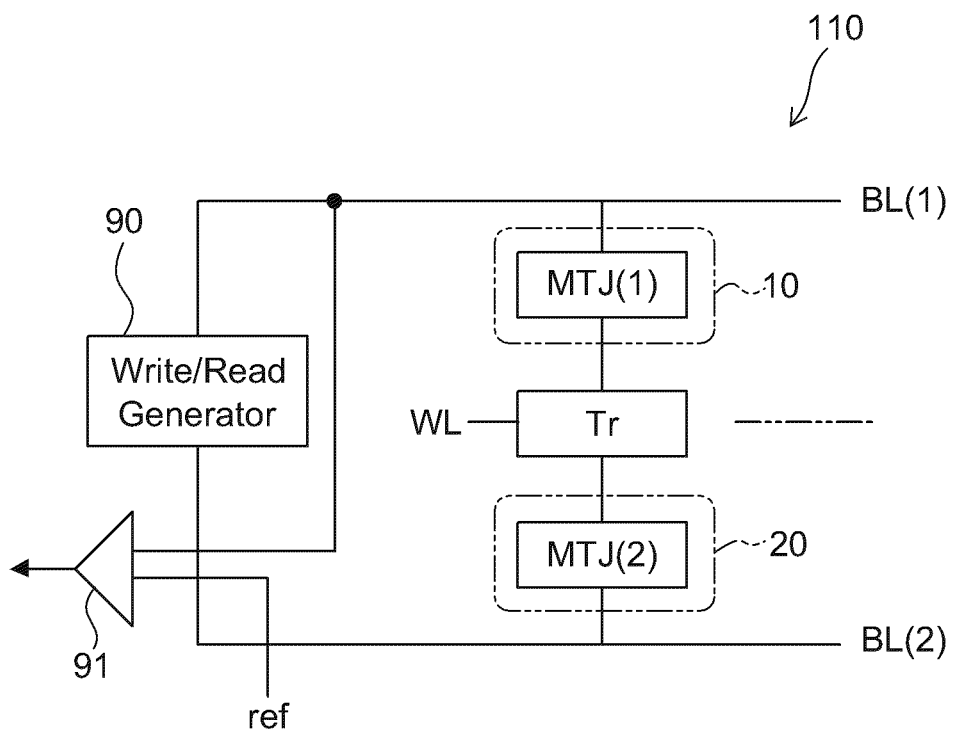

FIGS. 4A to 4B are views illustrating circuit configurations of the memory device.

FIG. 1A shows the cross section along an A-A line shown in FIG. 2. FIG. 3A shows the cross section along a B-B line shown in FIG. 2. FIG. 3B shows a C-C cross section shown in FIG. 2. FIG. 3C shows the cross section along a D-D line shown in FIG. 2. A memory device 110 according to the embodiment includes a first signal line BL(1), a second signal line BL(2), a transistor Tr, a memory region 10 and a conductive region 20.

The first signal line BL(1) and the second signal line BL(2) are bit lines, for example.

The transistor Tr controls the conduction of each of a current in a first direction flowing between the first signal line BL(1) and the second signal line BL(2) and a current in a second direction opposite to the first direction. The transistor Tr is a MISFET (Metal Insulator Semiconductor Field effect transistor), for example.

In the embodiment, a direction d1 of a current flowing from the second signal line BL(2) toward the first signal line BL(1) via the transistor Tr will be referred to as the first direction, and a direction d2 opposite thereto will be referred to as the second direction.

FIG. 2 schematically shows a planar layout of the memory device 110.

As shown in FIG. 2, in the memory device 110, a plurality of first signal lines BL(1) and a plurality of second signal lines BL(2) are alternately disposed at equal intervals, for example.

Here, in the embodiment, the direction in which the first signal line BL(1) and the second signal line BL(2) extend is referred to as an X-axis direction. The direction perpendicular to the X-axis direction shall be a Y-axis direction (a column direction).

Among the plurality of first signal lines BL(1) and the plurality of second signal lines BL(2), a pair of adjacent first signal line BL(1) and second signal line BL(2) is a set and each set handles an independent signal.

The transistor Tr is provided between the pair of first signal line BL(1) and the second signal line BL(2). Between the pair of adjacent first signal line BL(1) and second signal line BL(2), a plurality of transistors Tr are disposed in parallel.

A plurality of the transistors Tr are provided at a first pitch P1 in the X-axis direction and in the Y-axis direction, respectively.

A plurality of the first signal lines BL(1) and a plurality of the second signal lines BL(2) are disposed alternately in the Y-axis direction at a second pitch P2. That is, a plurality of the first signal lines BL(1) and a plurality of the second signal lines BL(2) are disposed alternately one by one at the second pitch P2 along the Y-axis direction. The second pitch P2 is a half of the first pitch P1.

In the direction perpendicular to the first signal line BL(1) and the second signal line BL(2) (the Y-axis direction), a plurality of control lines WL are disposed. The control line WL is, for example, a word line.

A plurality of the control lines WL are disposed in the X-axis direction at the first pitch P1.

While using the control line WL as a gate electrode, at cross positions of the first signal lines BL(1) and the second signal lines BL(2), and the control lines WL, transistors Tr are provided.

For each of a plurality of the transistors Tr, a memory region 10 and a conductive region 20 are formed. A plurality of the memory regions 10 and a plurality of the conductive regions 20 are disposed in the X-axis direction and the Y-axis direction, respectively, at the first pitch P1. A plurality of the memory regions 10 and a plurality of the conductive regions 20 are disposed with a half pitch (a half of the first pitch P1) offset to each other in the X-axis direction and in the Y-axis direction.

FIG. 1A shows the cross section centered on one of such a plurality of the transistors Tr. In the memory device 110 according to the embodiment, the configuration centered on this one transistor Tr is regarded as one unit. Then, along the direction of the first signal line BL(1) and second signal line BL(2) and along the direction of the control line WL, a plurality of units are disposed in a matrix. Because the configuration of this unit in the memory device 110 is the same, one unit is mainly described in the following description.

As shown in a circuit diagram of FIG. 4A and a block diagram of FIG. 4B, between the first signal line BL(1) and one end of the transistor Tr, the memory region 10 is connected. Moreover, between the second signal line BL(2) and the other end of the transistor Tr, the conductive region 20 is connected. Here, one end of the transistor Tr is a source or a drain of the transistor Tr. In the embodiment, the one end of the transistor Tr is the source. The other end of the transistor Tr is the drain or source of the transistor Tr. In the embodiment, the other end of the transistor Tr is the drain.

That is, the source side of the transistor Tr is connected to the first signal line BL(1) via the memory region 10, and the drain side thereof is connected to the second signal line BL(2) via the conductive region 20. Thus, upon selection of the control line WL of the transistor Tr, the memory region 10 and the conductive region 20 are connected in series between a pair of the first signal line BL(1) and the second signal line BL(2).

As shown in FIG. 1A, the memory region 10 includes a first magnetic tunnel junction element MTJ(1), a magnetization direction of which becomes parallel when a current not less than a first parallel threshold value flows in the direction d1 and the magnetization direction of which becomes antiparallel when a current not less than a first antiparallel threshold value flows in the direction d2.

The conductive region 20 has a second magnetic tunnel junction element MTJ(2). In the second magnetic tunnel junction element MTJ(2), the magnetization direction is maintained when any of a current not less than the first parallel threshold value and a current not less than the first antiparallel threshold value flows.

Meanwhile, in the second magnetic tunnel junction element MTJ(2), the magnetization direction becomes parallel when a current not less than a second parallel threshold value larger than the first parallel threshold value flows in the second direction d2, and the magnetization direction becomes antiparallel when a current not less than a second antiparallel threshold value larger than the first antiparallel threshold value flows in the first direction d1.

Here, the parallel threshold value and the antiparallel threshold value each are the threshold value of a current at which the magnetization direction of the magnetic tunnel junction element inverts, and this current value is referred to also as a "threshold value of magnetization inversion" in the embodiment.

FIG. 1B is a schematic cross sectional view illustrating the structure of the first magnetic tunnel junction element MTJ(1), and FIG. 1C is a schematic cross sectional view illustrating the structure of the second magnetic tunnel junction element MTJ(2).

The first magnetic tunnel junction element MTJ(1) includes a first stacked body ST1, wherein a first magnetization free layer 101(1) being a first lower ferromagnetic material layer, a first tunnel barrier layer 102(1) and a first magnetization fixed layer 103(1) being a first upper ferromagnetic material layer are stacked in this order. Here, the stacking direction of these layers shall be called "a Z-axis direction." Moreover, in the Z-axis direction, the direction from the first magnetization free layer 101(1) toward the first magnetization fixed layer 103(1) is referred to also as an upward direction (upper side) and the direction opposite thereto is referred to also as downward direction (lower side). The Z-axis direction is the direction perpendicular to the X-axis direction and the Y-axis direction.

In the first magnetic tunnel junction element MTJ(1), a first lower layer 104(1) is provided on the lower side of the first magnetization free layer 101(1), while on the upper side of the first magnetization fixed layer 103(1), a first upper conductive layer 105(1) is provided.

The first magnetization fixed layer 103(1) includes an antiferromagnetic layer or a ferromagnetic layer, and is provided so that the magnetization direction (direction of spin) is difficult to invert. On the other hand, the first magnetization free layer 101(1) includes a ferromagnetic layer, and is provided so that the magnetization direction is easy to invert.

In the first magnetic tunnel junction element MTJ(1), depending on whether the magnetization direction of the first magnetization free layer 101(1) with respect to the magnetization direction of the first magnetization fixed layer 103(1) is parallel or antiparallel, a change occurs in the resistance value of a tunnel current passing through the first tunnel barrier layer 102(1).

Accordingly, in the first magnetic tunnel junction element MTJ(1), the magnetization direction of the first magnetization free layer 101(1) is controlled in accordance with the information desired to store, so that a change in the resistance value can be read utilizing the amount of a tunnel current and the stored information can be read.

Here, a state where the magnetization direction of the magnetization free layer (e.g., the first magnetization free layer 101(1)) is parallel to the magnetization direction of a magnetization fixed layer (e.g., the first magnetization fixed layer 103(1)) will be referred to as a parallel state (hereinafter, "P state"), and a state where it is antiparallel will be referred to as an antiparallel state (hereinafter, "AP state").

In the first magnetic tunnel junction element MTJ(1), when a current not less than the first parallel threshold value or a current not less than the first antiparallel threshold value flows between the first magnetization free layer 101(1) and the first magnetization fixed layer 103(1), the magnetization direction of the first magnetization free layer 101(1) will invert.

Specifically, when a current (i1P) not less than the first parallel threshold value flows from the first magnetization free layer 101(1) toward the first magnetization fixed layer 103(1), the magnetization direction of the first magnetization free layer 101(1) is put in the P state. That is, the first magnetic tunnel junction element MTJ(1) is put in the P state by the current (i1P) in the direction d1.

On the other hand, when a current (i1A) not less than the first antiparallel threshold value flows from the first magnetization fixed layer 103(1) toward the first magnetization free layer 101(1), the magnetization direction of the first magnetization free layer 101(1) is put in the AP state. That is, the first magnetic tunnel junction element MTJ(1) is put in the AP state by the current (i1A) in the direction d2.

Here, the current i1A is larger than the current i1P. For example, the current i1A is around 1.2 times the current i1P.

The second magnetic tunnel junction element MTJ(2) has the same structure as the first magnetic tunnel junction element MTJ(1). That is, the second magnetization free layer 101(2) being the second lower ferromagnetic material layer corresponds to the first magnetization free layer 101(1), the second tunnel barrier layer 102(2) corresponds to the first tunnel barrier layer 102(1), and the second magnetization fixed layer 103(2) being the second upper ferromagnetic material layer corresponds to the first magnetization fixed layer 103(1). The second lower layer 104(2) corresponds to the first lower layer 104(1), and the second upper electroconductive layer 105(2) corresponds to the first upper electroconductive layer 105(1).

In the second magnetic tunnel junction element MTJ(2), when a current not less than the second parallel threshold value larger than the first parallel threshold value or a current not less than the second antiparallel threshold value larger than the first antiparallel threshold value flows between the second magnetization free layer 101(2) and the second magnetization fixed layer 103(2), the magnetization direction of the second magnetization free layer 101(2) will invert.

However, in the second magnetic tunnel junction element MTJ(2), even when currents (i1P and i1A) that invert the magnetization direction of the first magnetic tunnel junction element MTJ(1) flow, the magnetization direction is not inverted but is maintained.

In the embodiment, the magnetization direction of the second magnetic tunnel junction element MTJ(2) is maintained in the P state. Accordingly, the second magnetic tunnel junction element MTJ(2) is in a state of a low resistance to function as the conductive region 20.

In the memory device 110 according to the embodiment, the currents i1P and i1A control the A state and the AP state of the first magnetic tunnel junction element MTJ(1) to store information in the memory region 10. In other words, the memory device 110 according to the embodiment can store binary information by the A state and the AP state of the first magnetic tunnel junction element MTJ(1).

In any of a case of recording information in the memory region 10, and a case of reading out information from the memory region 10, the second magnetic tunnel junction element MTJ(2) is maintained in the P state, that is, in the state of a low resistance, and, consequently, functions as the conductive region 20 even when it has a layer structure of a magnetic tunnel junction element.

Here, an example of the arrangement of each part of the memory device 110 according to the embodiment is described.

As shown in FIG. 1A, the transistor Tr is formed in a semiconductor substrate 50 made from silicon, for example. In the semiconductor substrate 50, a source region 61 and a drain region 62 of the transistor Tr are formed at a predetermined interval. On a major surface 50a of the semiconductor substrate 50, between the source region 61 and the drain region 62, the control line WL is provided via a gate insulating film 63. With the control line WL as a gate electrode, ON/OFF of the transistor Tr is controlled.

On the major surface 50a of the semiconductor substrate 50, an insulating film 81 covering the control line WL is provided. Above the source region 61 of the transistor Tr, a first via 31 penetrating through the insulating film 81 is provided. The first via 31 is conductive with the source region 61. On the other hand, above the drain region 62 of the transistor Tr, a second via 32 penetrating through the insulating film 81 is provided. The second via 32 is conductive with the drain region 62.

On the first via 31 is provided a first lower metal 41(1), on which the first magnetic tunnel junction element MTJ(1) is provided. Moreover, on the second via 32 is provided a second lower metal 41(2), on which the second magnetic tunnel junction element MTJ(2) is provided.

On the first magnetic tunnel junction element MTJ(1) is provided a first upper metal 42(1), on which the first signal line BL(1) is provided. Moreover, on the second magnetic tunnel junction element MTJ(2) is provided a second upper metal 42(2), on which the second signal line BL(2) is provided.

An insulating film 82 is provided around the first magnetic tunnel junction element MTJ(1) and the second magnetic tunnel junction element MTJ(2). The first signal line BL(1) and the second signal line BL(2) are exposed on the upper side of the insulating film 82.

Here, in order to change the threshold value of the magnetization inversion of the first magnetic tunnel junction element MTJ(1) and the second magnetic tunnel junction element MTJ(2), there are a method for changing the material of a layer constituting the first stacked body ST1 and the second stacked body ST2 and a method for changing the volume of the first magnetization free layer 101(1) and the second magnetization free layer 101(2).

In the embodiment, as one example, the threshold value of the magnetization inversion is changed by changing the volume of the first magnetization free layer 101(1) and the second magnetization free layer 101(2). The larger the volume of the first magnetization free layer 101(1) and the second magnetization free layer 101(2), the larger the threshold value of the magnetization inversion becomes.

In the embodiment, the first magnetization free layer 101(1) of the first stacked body ST1 and the second magnetization free layer 101(2) of the second stacked body ST2 are provided in the same thickness on the same plane. The materials of both layers are the same.

The first tunnel barrier layer 102(1) of the first stacked body ST1 and the second tunnel barrier layer 102(2) of the second stacked body ST2 are provided in the same thickness on the same plane. The materials of both layers are the same.

The first magnetization fixed layer 103(1) of the first stacked body ST1 and the second magnetization fixed layer 103(2) of the second stacked body ST2 are provided in the same thickness on the same plane. The materials of both layers are the same.

Therefore, by changing the area of an outside shape seen in the Z-axis direction of the first stacked body ST1 and the second stacked body ST2, the volume of the first magnetization free layer 101(1) and the second magnetization free layer 101(2) will change and the threshold value of the magnetization inversion can be changed.

As shown in FIG. 2, the outside shape seen in the Z-axis direction of the first magnetic tunnel junction element MTJ(1) and the second magnetic tunnel junction element MTJ(2), i.e., the outside shape seen in the Z-axis direction of the first stacked body ST1 and the second stacked body ST2 is circular. In the embodiment, a diameter D2 of the second magnetic tunnel junction element MTJ(2) is set larger than a diameter D1 of the first magnetic tunnel junction element MTJ(1). Thus, the volume of the second magnetization free layer 101(2) becomes larger than the volume of the first magnetization free layer 101(1), and, even when the currents (i1P and i1A) flow in the second magnetic tunnel junction element MTJ(2), the magnetization direction is not inverted but is maintained.

On the other hand, the resistance values of the first magnetic tunnel junction element MTJ(1) and the second magnetic tunnel junction element MTJ(2) in the P state are inversely proportional to areas of the outer shapes seen in the Z-axis direction. In the embodiment, by setting the area of the second magnetic tunnel junction element MTJ(2) seen in the Z-axis direction to be larger than the area of the first magnetic tunnel junction element MTJ(1), a low resistance in the P state is realized, and even the magnetic tunnel junction element can function as the conductive region 20.

As a specific example, the diameter D2 of the second magnetic tunnel junction element MTJ(2) is set to be about 2.0 times relative to the diameter D1 of the first magnetic tunnel junction element MTJ(1).

Consequently, the resistance value of the second magnetic tunnel junction element MTJ(2) in the P state is about 0.5 times the resistance value of the first magnetic tunnel junction element MTJ(1) in the P state.

As described before, in the memory device 110 according to the embodiment, the first stacked body ST1 and the second stacked body ST2 have the same layer structure. Accordingly, after stacking uniformly each of the magnetization free layer, the tunnel barrier layer and the magnetization fixed layer, one etching can form the first stacked body ST1 and the second stacked body ST2 of the diameters D1 and D2, respectively.

Meanwhile, in the embodiment, the conductive region 20 has not necessarily the configuration including the second magnetic tunnel junction element MTJ(2). And, the conductive region 20 has not necessarily the configuration including a ferromagnetic material. That is, the conductive region 20 may be configured simply by a conductive member.

As shown in FIG. 2, by laying out a plurality of the memory regions 10 and a plurality of the conductive regions 20 at even pitches in the X-axis direction and the Y-axis direction, an exposure process can be decreased when forming a plurality of the memory regions 10 and a plurality of the conductive regions 20. In other words, when they are laid out at uneven pitches, since balance in photolithography is hardly adjusted, it is necessary to form each of the memory region 10 and the conductive region 20 by separated exposure processes. On the other hand, when they are laid out at even pitches, the balance in photolithography is adjusted, and the memory region 10 and the conductive region 20 can be formed in the same exposure process. Consequently, the number of exposure processes can be decreased.

Moreover, when the conductive region 20 is configured simply by a conductive member, both the outer shape of the memory region 10 and the outer shape of the conductive region 20 seen in the Z-axis direction can be made equal to make it possible to furthermore adjust the balance in the photolithography and to manufacture products of high precision.

Next, the operation of the memory device 110 according to the embodiment is described.

As shown in FIG. 4B, a signal generator 90 and a sense amplifier 91 are provided as the peripheral circuit of the memory device 110. In the signal generator 90, a write voltage or a read voltage is applied between the first signal line BL(1) and second signal line BL(2).

To one input of the sense amplifier 91, for example, the voltage of the first signal line BL(1) is input, while to the other input, a reference voltage ref is input. The comparison result by the sense amplifier 91 is the readout value of the stored information.

Next, a specific example of the write operation of information is described.

When writing information, the signal generator 90 applies a voltage, as the write voltage, for flowing any of the current i1P or the i1A between the first signal line BL(1) and the second signal line BL(2).

Prior to writing information, the second magnetic tunnel junction element MTJ(2) has been put in the P state, that is, a low resistance state.

Figure 5A:
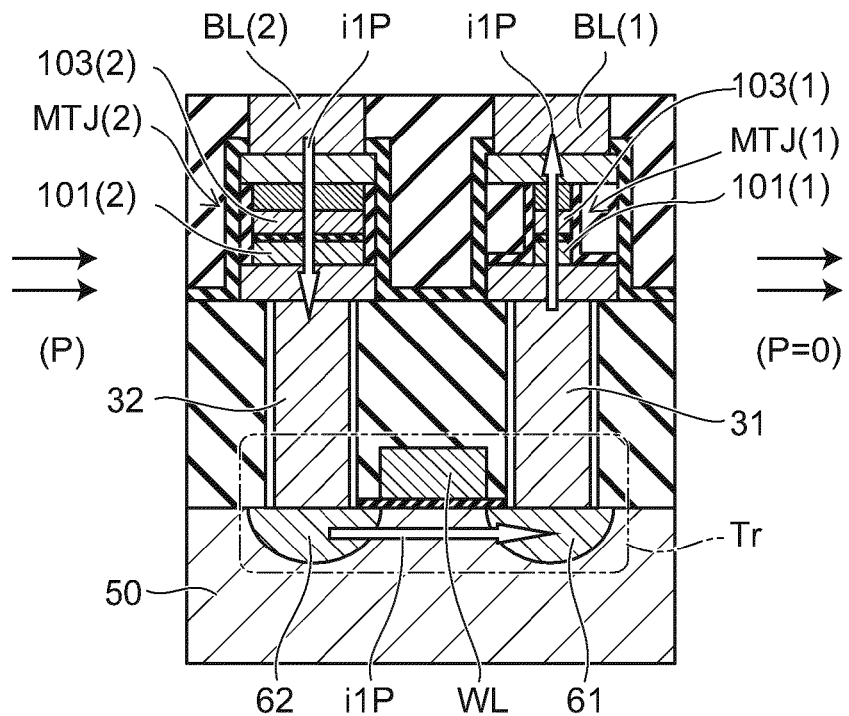
FIGS. 5A and 5B are schematic cross-sectional views for explaining a specific writing operation.
Figure 5B:
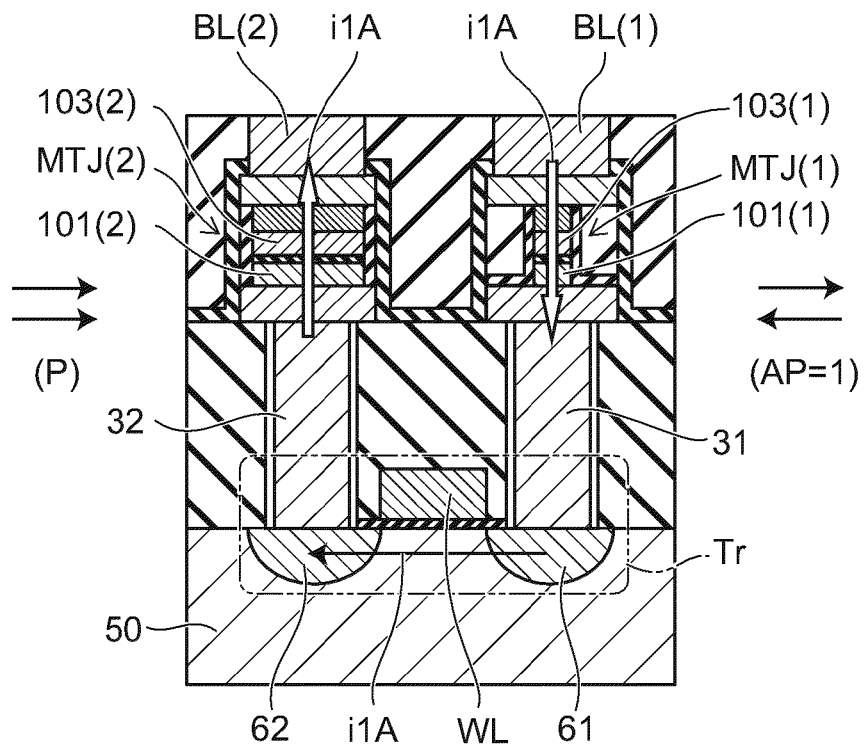

FIGS. 5A and 5B are schematic cross-sectional views for explaining a specific writing operation.

FIG. 5A illustrates an operation when the control line WL of the transistor Tr is selected and the current i1P is flown from the second signal line BL(2) to the first signal line BL(1).

To the first magnetic tunnel junction element MTJ(1), the current i1P flows from the first magnetization free layer 101(1) toward the first magnetization fixed layer 103(1). The current i1P has a current value not less than the threshold value of the magnetization inversion (the first parallel threshold value) of the first magnetic tunnel junction element MTJ(1). Accordingly, as a result of the flow of the current i1P, the first magnetic tunnel junction element MTJ(1) is put in the P state.

On the other hand, to the second magnetic tunnel junction element MTJ(2), the current i1P flows from the second magnetization fixed layer 103(2) toward the second magnetization free layer 101(2). The current i1P has a current value smaller than the threshold value of the magnetization inversion of the second magnetic tunnel junction element MTJ(2). Accordingly, even when the current i1P flows to the second magnetic tunnel junction element MTJ(2), the magnetization is not inverted and, consequently, the P state is maintained.

In the embodiment, it is assumed that the AP state shall be a bit of "1," and the P state shall be a bit of "0." Accordingly, in the operation illustrated in FIG. 5A, "0" is to be stored.

FIG. 5B illustrates an operation when the control line WL of the transistor Tr is selected, and the current i1A is flown from the first signal line BL(1) to the second signal line BL(2).

To the first magnetic tunnel junction element MTJ(1), the current i1A flows from the first magnetization fixed layer 103(1) toward the first magnetization free layer 101(1). The current i1A has a current value not less than the threshold value of the magnetization inversion (the first antiparallel threshold value) of the first magnetic tunnel junction element MTJ(1). Accordingly, as a result of the flow of the current i1A, the first magnetic tunnel junction element MTJ(1) is put in the AP state.

On the other hand, to the second magnetic tunnel junction element MTJ(2), the current i1A flows from the second magnetization free layer 101(2) toward the second magnetization fixed layer 103(2). The current i1A has a current value smaller than the threshold value of the magnetization inversion of the second magnetic tunnel junction element MTJ(2). Accordingly, even when the current i1A flows to the second magnetic tunnel junction element MTJ(2), the magnetization is not inverted but, consequently, the P state is maintained.

Accordingly, in the operation illustrated in FIG. 5B, "1" is to be stored.

In any of the above-mentioned writing operations, the second magnetic tunnel junction element MTJ(2) is maintained in the P state, and is kept in the state of a low resistance. As the result, in both writing operations in which even either of the currents i1P and i1A is flown, the second magnetic tunnel junction element MTJ(2) functions as a current path of the conductive region 20.

Next, a specific example of reading operation of information is explained.

When the reading of information is performed, the signal generator 90 applies, as the read-out voltage, a read-out voltage between the first signal line BL(1) and the second signal line BL(2). The read-out voltage is lower than the voltage for making the currents i1P and i1A flow in the writing.

As shown in FIG. 4B, in the first magnetic tunnel junction element MTJ(1), the resistance value changes depending on the AP state and the P state. On the other hand, the second magnetic tunnel junction element MTJ(2) is maintained in the P state, that is, in the state of a low resistance. Accordingly, when the read-out voltage is applied, the second magnetic tunnel junction element MTJ(2) functions as a current path of the conductive region 20. As the result, difference between the first signal line BL(1) and the reference voltage ref changes, to make the performance of determination of the stored information possible.

Here, an example of the resistance value according to the P state and the AP state of the first magnetic tunnel junction element MTJ(1) is shown.

When the first magnetic tunnel junction element MTJ(1) is in the AP state, the resistance value is, for example, 7 kilo ohms (k$\Omega$). When assuming that an MR ratio (a magnetoresistive ratio) of the first magnetic tunnel junction element MTJ(1) to be, for example, 200%, the total resistance value based on the P state ("0") and the AP state ("1") of the first magnetic tunnel junction element MTJ(1) becomes as follows.

In the case of "0," the total resistance value is 10 k$\Omega$ (parasitic resistance).

In the case of "1," the total resistance value is 24 k$\Omega$.

An output of the sense amplifier 91 changes in accordance with the resistance value. Accordingly, in accordance with the output of the sense amplifier 91, the stored information can be determined.

As described above, the memory device 110 can perform the writing and reading of information by the change of the resistance value in the P state and the AP state of the first magnetic tunnel junction element MTJ(1). And, in any of the writing operation and the reading operation, the second magnetic tunnel junction element MTJ(2) functions as the conductive region 20. In the embodiment, since the first stacked body ST1 and the second stacked body ST2 are set to have the same layer structure, it is unnecessary to provide a separated conductive part (such as a via) between the transistor Tr and the second signal line BL(2), and the manufacturing process can be made simple.

Second Embodiment

Next, as a second embodiment, a method of manufacturing the memory device 110 is explained.

FIGS. 6A to 9B are schematic cross-sectional views for explaining a manufacturing method according to the embodiment.

Figure 6A:
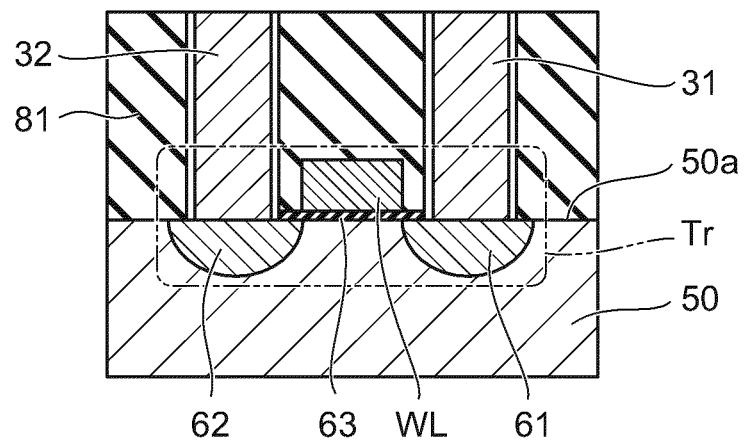
FIGS. 6A to 9B are schematic cross-sectional views for explaining a manufacturing method according to the embodiment.

First, as shown in FIG. 6A, by utilizing, for example, a CMOS (Complementary Metal Oxide Semiconductor) process, the transistor Tr is formed on the semiconductor substrate 50. As the result, on the main surface 50a side of the semiconductor substrate 50, the source region 61 and the drain region 62 are formed, and, between these, the control line WL is formed via the gate insulating film 63.

Next, on the transistor Tr, the insulating film 81 is formed, and on the source region 61 and the drain region 62, the first via 31 and the second via 32 passing through the insulating film 81 are formed. In order to form the first via 31 and the second via 32, first, a through hole is formed in the insulating film 81, a barrier metal is formed on an inside wall of the through hole, and, after that, tungsten (W) is embedded, for example, by CVD (Chemical Vapor Deposition). After that, by CMP (Chemical Mechanical Polishing), the surface is subjected to planarization.

Figure 6B:
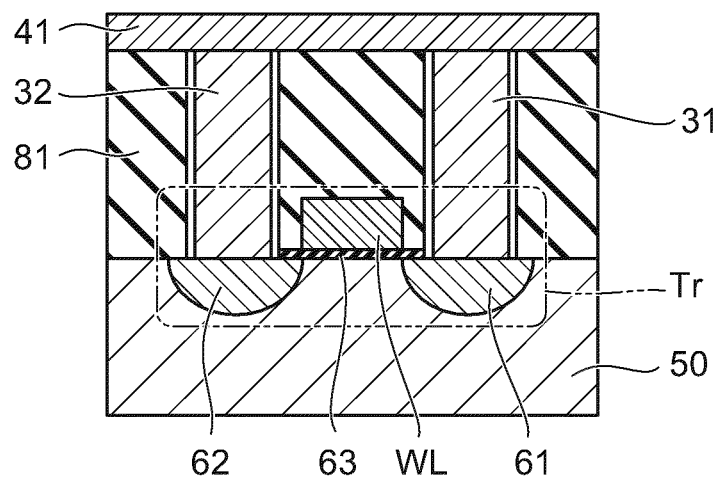

Next, as shown in FIG. 6B, on the planarized insulating film 81, a foundation metal layer 41 is formed. As the foundation metal layer 41, for example, tantalum (Ta) is used. Surface roughness of the foundation metal layer 41 is, for example, not more than 0.2 nanometers (nm).

Figure 7A:
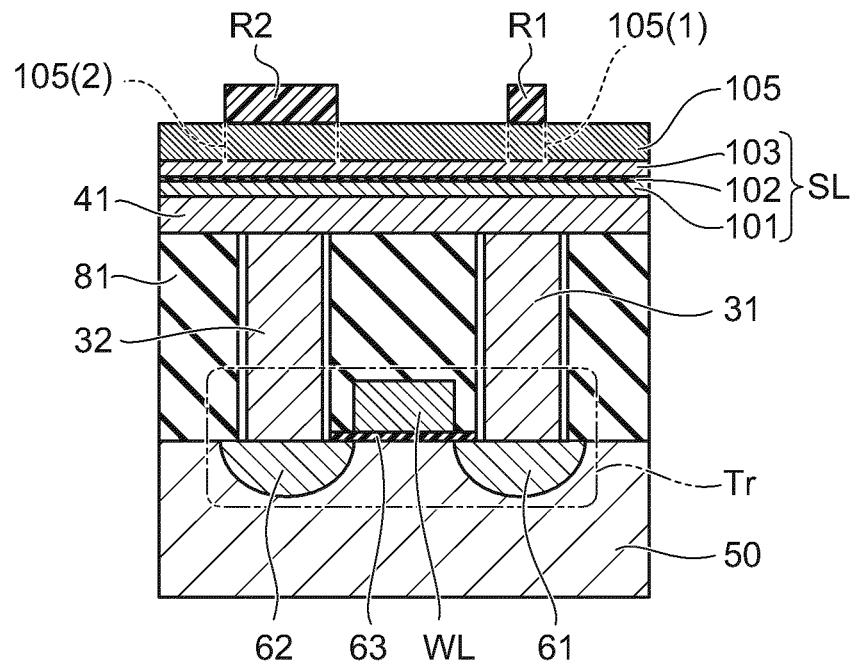

Next, as shown in FIG. 7A, on the foundation metal layer 41, a stacked film SL stacking the magnetization free layer 101, the tunnel barrier layer 102 and the magnetization fixed layer 103 in the order is formed. On the stacked film SL, an upper electroconductive layer material 105 is formed. Meanwhile, the stacked film SL and the upper electroconductive layer material 105 may be deposited continuously.

As the magnetization free layer 101, for example, CoFeB is used. As the tunnel barrier layer 102, for example, MgO is used. As the magnetization fixed layer 103, for example, CoFeB is used.

And, as the upper electroconductive layer material 105, for example, $SiO_2$, SiN, Ta, $TiAl_xN_y$, TaN, TiN, WN, W, $Al_2O_3$ are suitable. The upper electroconductive layer material 105 may be formed into a single layer film using any one of these materials, or into a stacked film that uses at least two of these.

Next, on the upper electroconductive layer material 105, a resist is coated and, by photolithography, resist patterns R1 and R2 are formed. Then, using these resist patterns R1 and R2 as masks, the upper electroconductive layer material 105 is etched. As the etching method, for example, any of RIE (Reactive Ion Etching), IBE (Ion Beam Etching) and wet etching is used. If necessary, these may be used in combination for etching. Remaining parts without being etched become the first upper electroconductive layer 105(1) and the second upper electroconductive layer 105(2).

The first upper electroconductive layer 105(1) and the second upper electroconductive layer 105(2) are utilized as a hard mask in the subsequent etching. Accordingly, the outer shapes of the first upper electroconductive layer 105(1) and the second upper electroconductive layer 105(2) seen in the Z-axis direction correspond to the outer shapes of the first magnetic tunnel junction element MTJ(1) and the second magnetic tunnel junction element MTJ(2). By the outer shapes of the first upper electroconductive layer 105(1) and the second upper electroconductive layer 105(2), sizes of the first magnetic tunnel junction element MTJ(1) and the second magnetic tunnel junction element MTJ(2) can be set. In the embodiment, for example, each of the outer shapes of the first upper electroconductive layer 105(1) and the second upper electroconductive layer 105(2) seen in the Z-axis direction is set to be circular, and the diameter of the second upper electroconductive layer 105(2) is set to be about 2.0 times the diameter of the first upper electroconductive layer 105(1).

Figure 7B:
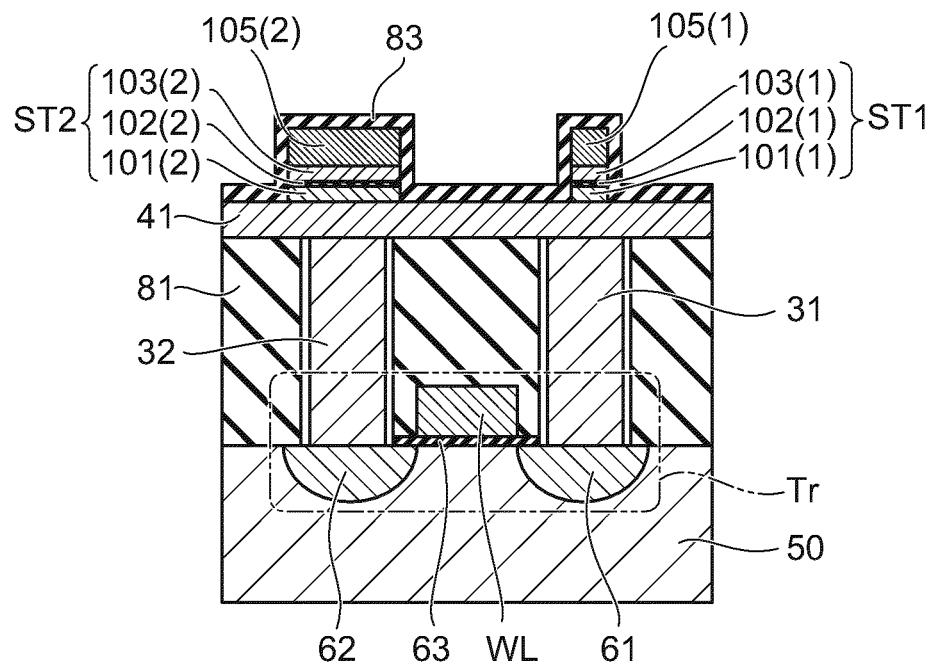

After that, the first upper electroconductive layer 105(1) and the second upper electroconductive layer 105(2) are utilized as hard mask layers to etch the stacked film SL. As an etching method, for example, any of RIE, high temperature RIE (for example, 150° C. to 300° C.) and IBE is used. If necessary, the etching may be performed by combining these. By the etching, as shown in FIG. 7B, the first stacked body ST1 being a part of the remaining stacked film SL and the second stacked body ST2 being another part of the remaining stacked film SL are formed. In other words, on the lower side of the first upper electroconductive layer 105(1), the first stacked body ST1 by the first magnetization free layer 101(1), the first tunnel barrier layer 102(1) and the first magnetization fixed layer 103(1) is formed, and, on the lower side of the second upper electroconductive layer 105(2), the second stacked body ST2 by the second magnetization free layer 101(2), the second tunnel barrier layer 102(2) and the second magnetization fixed layer 103(2) is formed. The area of the first stacked body ST1 seen in the Z-axis direction is smaller than the area of the second stacked body ST2 seen in the Z-axis direction.

After forming the first stacked body ST1 and the second stacked body ST2, these are covered with a protective film 83. As the protective film 83, for example, either of $Si_xN_y$, $Al_2O_3$, $Al_xO_y$ (oxygen rich: x=less than 2, y=3), $SiO_2$, $SiAl_xO_y$, $TiO_2$ and $ZrO_2$, or a combination of at least two of these is used. As a film forming method, for example, a sputtering method (including oblique incidence deposition), CVD, or ALD (Atomic Layer Deposition) is used. In the embodiment, as an example of the protective film 83, SiN is formed by a sputtering method (including oblique incidence deposition) as a thick film of 30 nm.

Figure 8A:
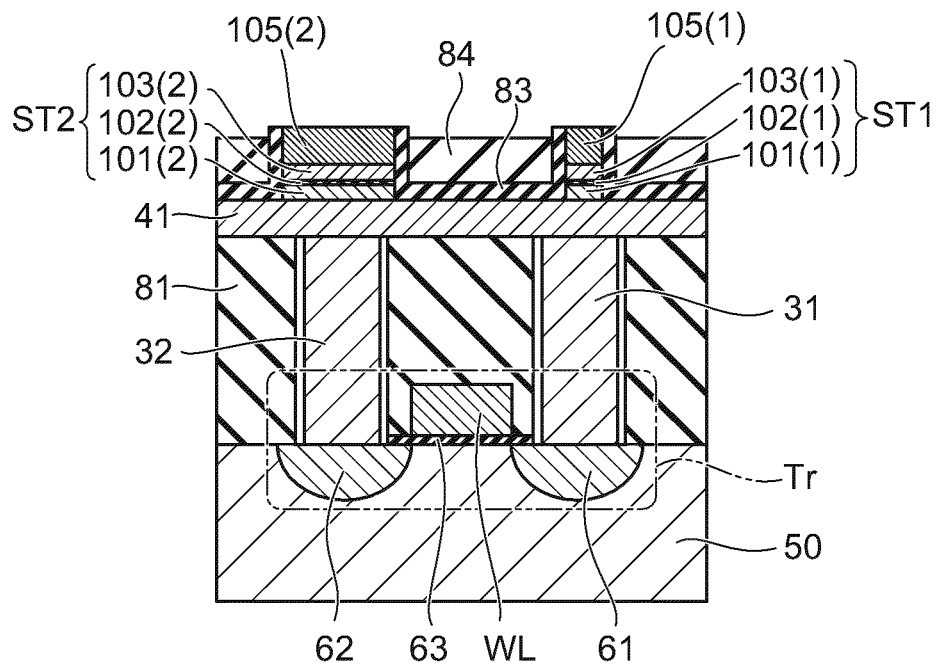

Next, as shown in FIG. 8A, an interlayer insulating film 84 is deposited and embedded between the first stacked body ST1 and the second stacked body ST2. As the interlayer insulating film 84, for example, $SiO_2$, SiOF or SiOC is used. Then, by CMP, the interlayer insulating film 84 is planarized. And, after the planarization, the interlayer insulating film 84 is etched back to expose a part of the upper side of the first upper electroconductive layer 105(1) and the second upper electroconductive layer 105(2).

Figure 8B:
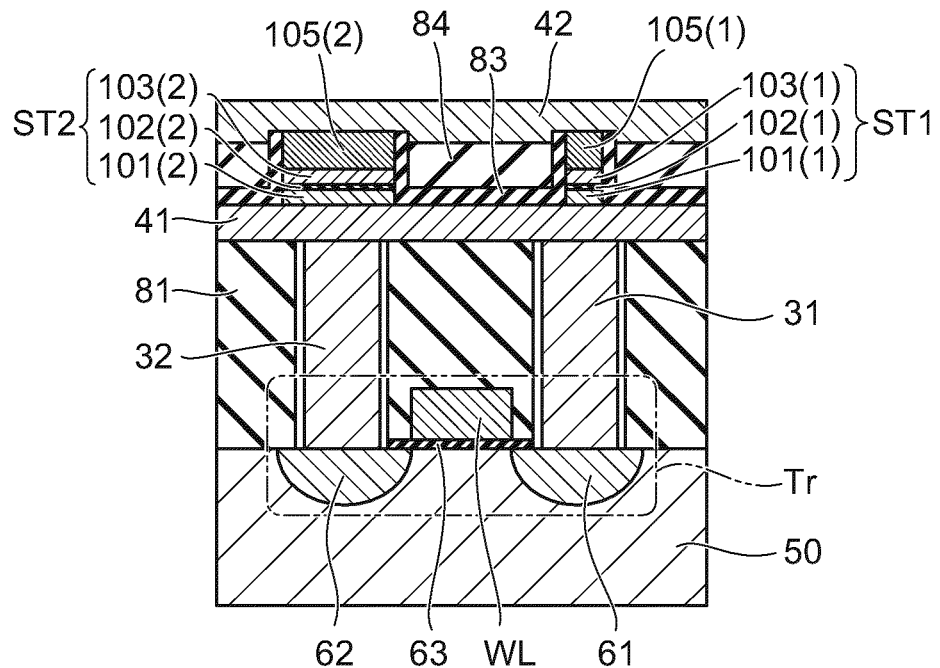

Next, as shown in FIG. 8B, on the exposed first upper electroconductive layer 105(1) and the second upper electroconductive layer 105(2), an upper metal material 42 is deposited to be in contact with the first upper electroconductive layer 105(1) and the second upper electroconductive layer 105(2). As the upper metal material 42, for example, Ti, Ta, TiN, W or TaN is used.

Figure 9A:
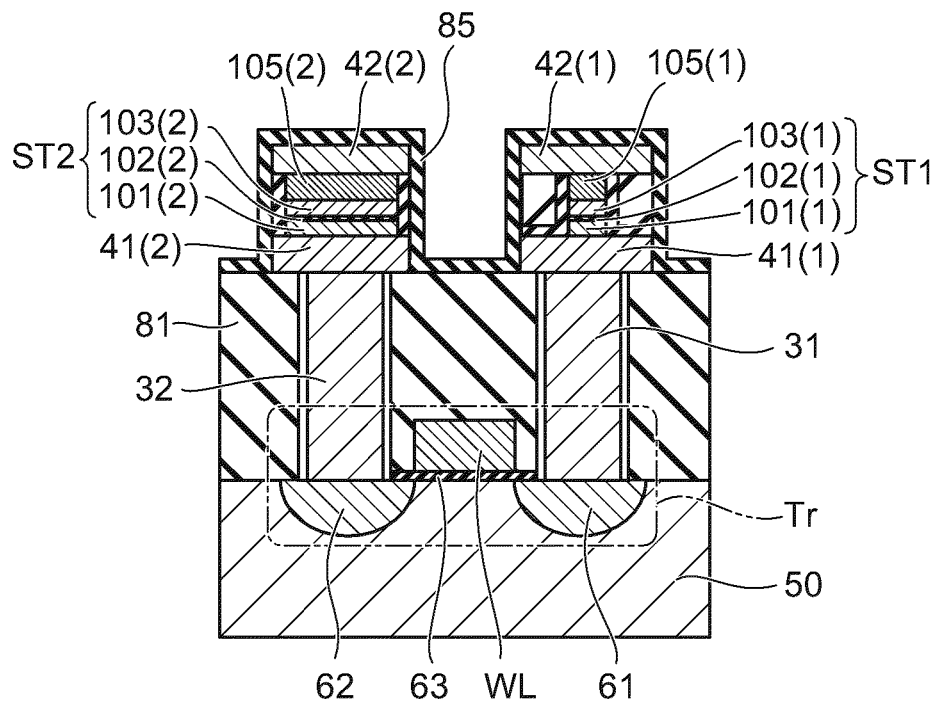

Next, by the photolithography and etching, a part of the upper metal material 42, the interlayer insulating film 84 and the foundation metal layer 41 are removed. As the result, as shown in FIG. 9A, the upper metal material 42, the interlayer insulating film 84 and the foundation metal layer 41 other than a part including the first stacked body ST1 and the second stacked body ST2 seen from the Z-axis direction are removed. After that, a protective film 85 is deposited. The material of the protective film 85 is the same as the material of the protective film 83.

Figure 9B:
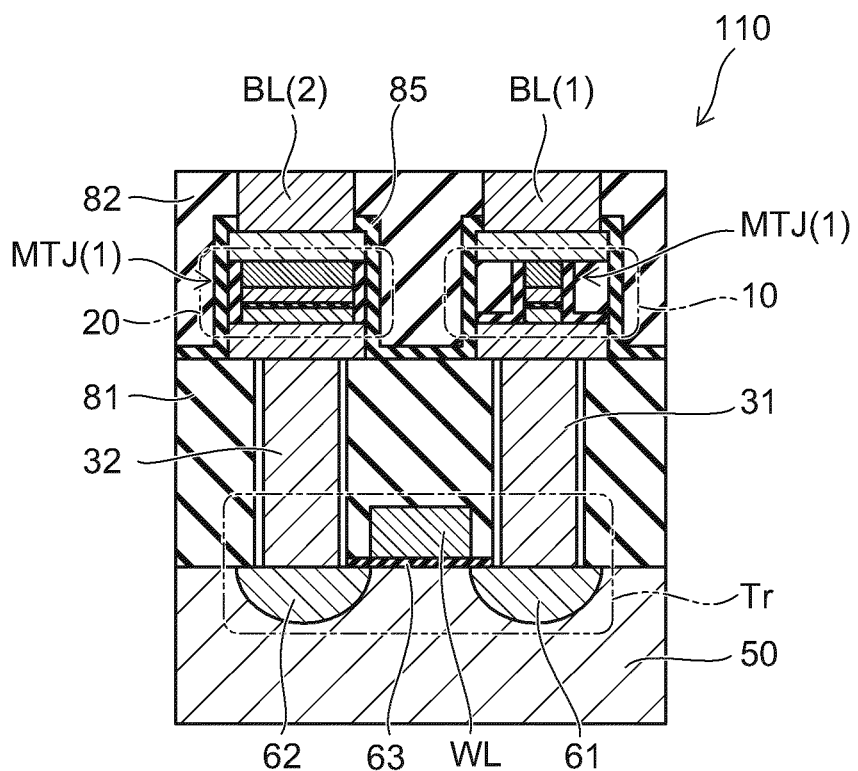

Next, as shown in FIG. 9B, on the protective film 85, the insulating film 82 is deposited, and after performing the planarization of the surface, the first signal line BL(1) and the second signal line BL(2) by copper (Cu) are formed, for example, by a damascene method. As the result, between the first signal line BL(1) and the first via 31, the memory region 10 having the first magnetic tunnel junction element MTJ(1) is formed, and, between the second signal line BL(2) and the second via 32, the conductive region 20 having the second magnetic tunnel junction element MTJ(2) is formed.

As the result of these processes, the memory device 110 is completed.

In the above-mentioned manufacturing method, as processes shown in FIGS. 7A and 7B, the magnetization free layer 101, the tunnel barrier layer 102 and the magnetization fixed layer 103 are formed uniformly in this order, and, after that, the first stacked body ST1 and the second stacked body ST2 having different sizes are formed collectively by the etching. Accordingly, when compared with a case where the first stacked body ST1 is formed and, after that, a conductive member is formed on the second via 32 in a separated process, it becomes possible to achieve remarkably the simplification of the manufacturing process. Moreover, according to the sizes of the first upper electroconductive layer 105(1) and the second upper electroconductive layer 105(2) utilized as a hard mask in the etching, the sizes of the first stacked body ST1 and the second stacked body ST2 can be set simply and accurately, and it becomes possible to manufacture easily the first magnetization free layer 101(1) and the second magnetization free layer 101(2) having different volumes.

As shown in FIG. 2, the memory device 110 includes a plurality of the memory regions 10 (in FIG. 2, regions where the first magnetic tunnel junction element MTJ(1) are shown) and a plurality of the conductive regions 20 (in FIG. 2, regions where the second magnetic tunnel junction element MTJ(2) are shown).

A plurality of the memory regions 10 are disposed in the X-axis direction (the row direction) and the Y-axis direction (the column direction) at the same pitch (the first pitch P1), respectively.

Moreover, a plurality of the conductive regions 20 are disposed in the X-axis direction (the row direction) and the Y-axis direction (the column direction) at the same pitch (the first pitch P1, the same as that in the memory region 10), respectively.

A plurality of the memory regions 10 and a plurality of the conductive regions 20 are disposed with a half pitch offset to each other, in the X-axis direction and the Y-axis direction.

As the result of such layout, the balance of the photolithography used when forming the memory region 10 and the conductive region 20 is put in good order. Accordingly, even when the sizes of the memory region 10 and the conductive region 20 are different each other, variation of the manufacturing is suppressed to provide stable products.

Third Embodiment

Figure 10A:
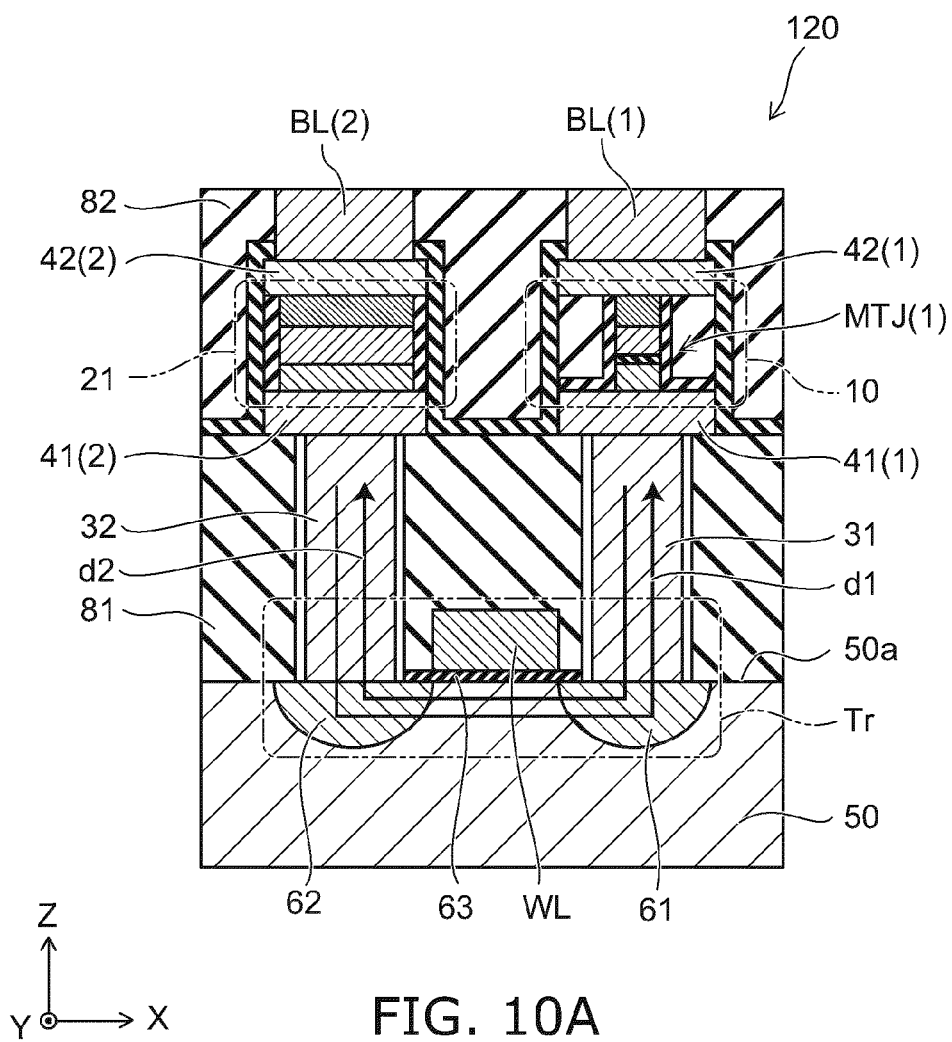
FIGS. 10A to 10C are schematic cross-sectional views illustrating a memory device according to a third embodiment.
Figures 10B, 10C:
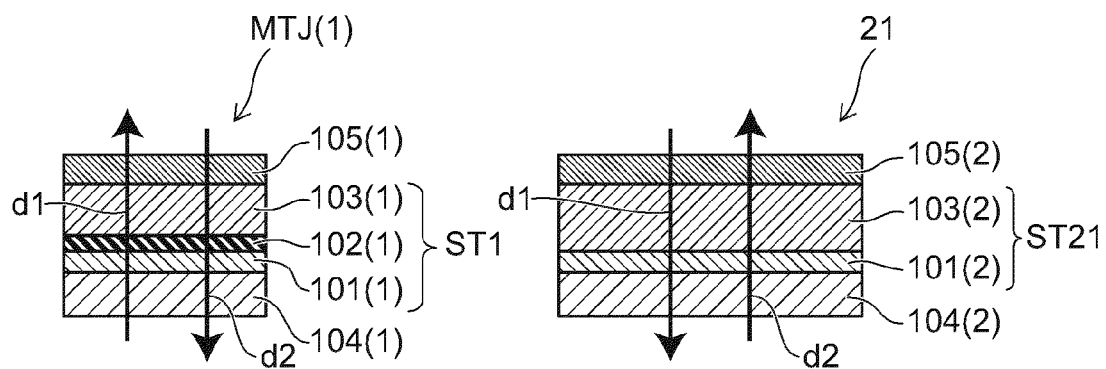

FIGS. 10A to 10C are schematic cross-sectional views illustrating a memory device according to a third embodiment.

FIG. 10A shows a cross-section wherein one among a plurality of the transistors Tr lies at the center.

FIG. 10B is a schematic cross-sectional view illustrating the structure of the first magnetic tunnel junction element MTJ(1), and FIG. 10C is a schematic cross-sectional view illustrating the structure of the conductive region.

As shown in FIG. 10, in a memory device 120 according to the embodiment, as compared with the memory device 110 shown in FIG. 1, the layer structure of the conductive region 21 is different.

That is, the conductive region 21 of the memory device 120 has the same layer structure as a part of the first magnetic tunnel junction element MTJ(1) of the memory region 10.

Specifically, the conductive region 21 in the memory device 120 includes the second magnetization free layer 101(2) and the second magnetization fixed layer 103(2) that are the same as a part of the stacked body ST1 of the first magnetic tunnel junction element MTJ(1). In other words, the stacked body ST21 of the conductive region 21 does not include the second tunnel barrier layer 102(2), which is included in the second stacked body ST2 of the conductive region 20.

In such memory device 120, a layer same as the stacked body ST1 of the first magnetic tunnel junction element MTJ (1) can be formed by the same manufacturing process, and the simplification of the manufacturing process can be achieved. On the other hand, the conductive region 21 does not include the second tunnel barrier layer 102(2), which is included in the second stacked body ST2 of the conductive region 20. Accordingly, the lowering of the resistance value of the conductive region 21 as compared with the conductive region 20 can be achieved.

Meanwhile, in the memory device 120 shown in FIG. 10, seen from the Z-axis direction, although the size of the outer shape of the first stacked body ST1 and the size of the outer shape of the stacked body ST21 are different each other, the shapes may be the same (have the same area). In other words, since no tunnel barrier layer is provided for the stacked body ST21, the body ST21 has sufficiently lowered resistance, even when it has the same outer shape as the first stacked body ST1. Consequently, the body ST21 can sufficiently exert function as the conductive region 20.

Fourth Embodiment

Next, as a fourth embodiment, a method for manufacturing the memory device 120 is explained.

FIGS. 11A to 12B are schematic cross-sectional views explaining a manufacturing method according to the embodiment.

Figure 11A:
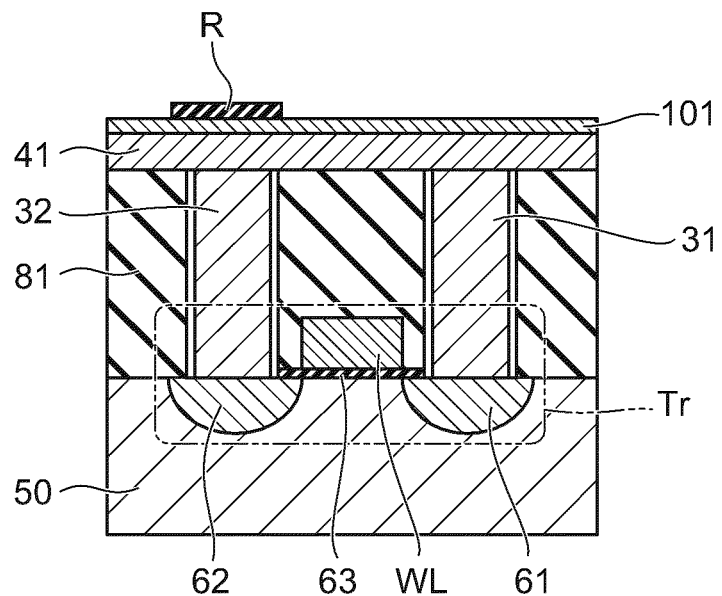
FIGS. 11A to 12B are schematic cross-sectional views explaining a manufacturing method according to the embodiment.

Here, processes until the formation of the transistor Tr on the semiconductor substrate 50, the formation of control line WL via the gate insulating film 63, the formation of the insulating film 81, the formation of the first via 31 and the second via 32, and the formation of the foundation metal layer 41 shown in FIG. 11A are similar to the processes shown in FIGS. 6A and 6B.

Next, on the foundation metal layer 41, a magnetization free layer 101A is formed. Subsequently, on the magnetization free layer 101A, resist is coated, and a resist pattern R is formed on the second via 32 on the magnetization free layer 101A by photolithography.

Figure 11B:
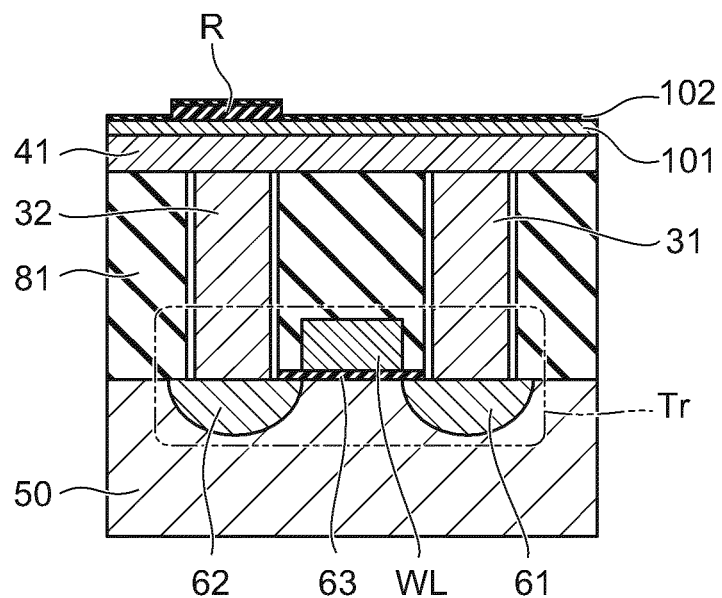
Figure 12A:
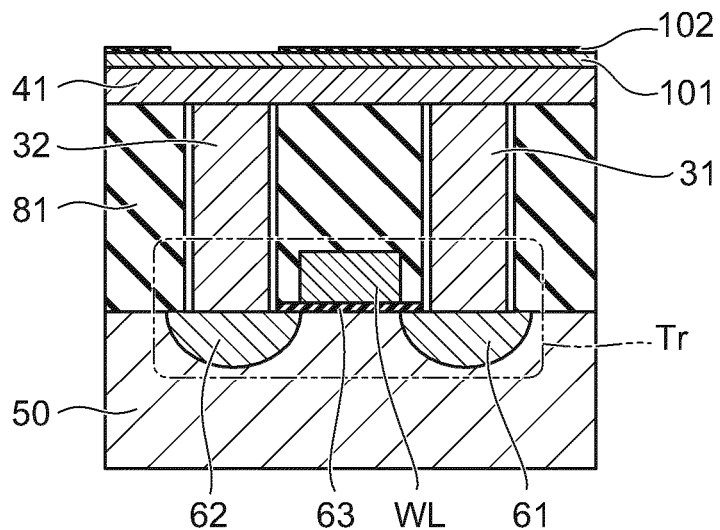

Next, as shown in FIG. 11B, on the magnetization free layer 101A and the resist pattern R, a tunnel barrier layer 102A is formed. And, by removing the resist pattern R, a part of the tunnel barrier layer 102A is lifted off. As the result, as shown in FIG. 12A, the tunnel barrier layer 102A on the second via 32 is removed and an opening is formed in the part.

Figure 12B:
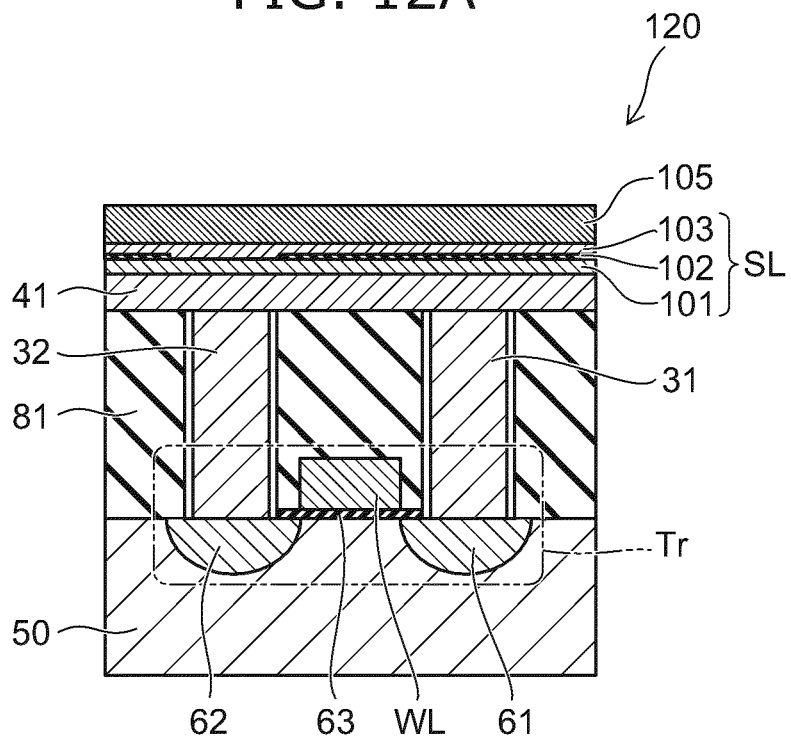

Next, as shown in FIG. 12B, on the tunnel barrier layer 102A in which the opening is formed, a magnetization fixed layer 103A and an upper electroconductive layer material 105A are stacked in order to form the stacked film SL. In the rest, in the same manner as processes shown in FIGS. 7B to 9B, the stacked film SL is etched to form the first stacked body ST1 and the stacked body ST21, thereby forming the memory region 10 and the conductive region 21.

By these processes, the memory device 120 is completed.

By the above-mentioned manufacturing method, by a single etching of the stacked film SL, the first stacked body ST1 and the stacked body ST21 can be formed collectively. Accordingly, when compared with a case where the first stacked body ST1 is formed and, after that, the conductive member is formed on the second via 32 by a separated process, it becomes possible to achieve large simplification of the manufacturing process.

Fifth Embodiment

Figure 13:
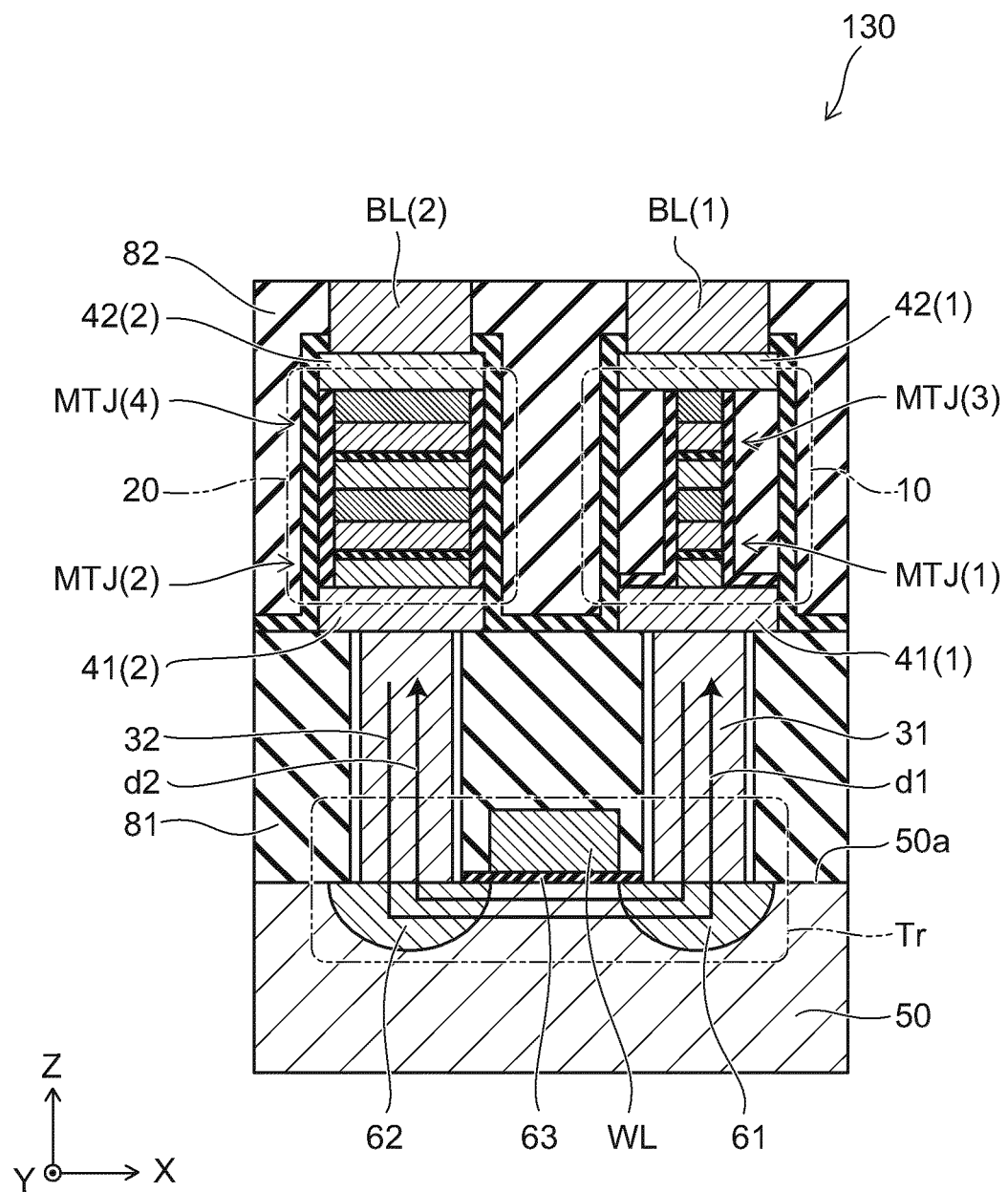
FIG. 13 is a schematic cross-sectional view illustrating a memory device according to a fifth embodiment.

FIG. 13 is a schematic cross-sectional view illustrating a memory device according to a fifth embodiment.

Figure 14A:
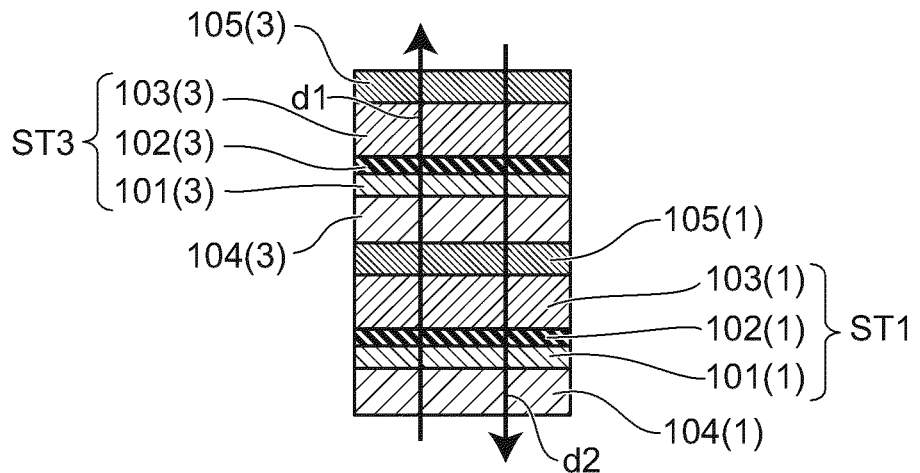
FIGS. 14A and 14B are schematic cross-sectional views illustrating a layer structure of the memory region and the conductive region.
Figure 14B:
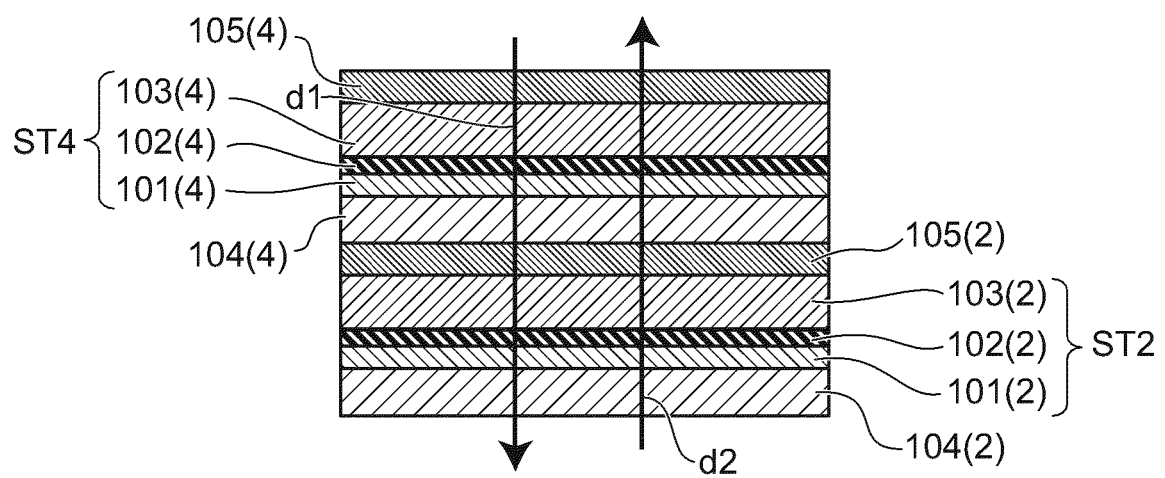

FIGS. 14A and 14B are schematic cross-sectional views illustrating a layer structure of the memory region and the conductive region.

As shown in FIG. 13, in a memory device 130 according to the embodiment, the memory region 10 includes the first magnetic tunnel junction element MTJ(1) and a third magnetic tunnel junction element MTJ(3), and the conductive region 20 includes the second magnetic tunnel junction element MTJ(2) and a fourth magnetic tunnel junction element MTJ(4).

The third magnetic tunnel junction element MTJ(3) is provided between the first signal line BL(1) and the first magnetic tunnel junction element MTJ(1). In the third magnetic tunnel junction element MTJ(3), the magnetization direction becomes parallel when a current not less than a third parallel threshold value different from the first parallel threshold value flows in the first direction d1, and the magnetization direction becomes antiparallel when a current not less than a third antiparallel threshold value different from the first antiparallel threshold value flows in the second direction d2. The third parallel threshold value is smaller, or larger than the first parallel threshold value. The third antiparallel threshold value is smaller, or larger than the first antiparallel threshold value. In the embodiment, a case, where the third parallel threshold value is smaller than the first parallel threshold value and the third antiparallel threshold value is smaller than the first antiparallel threshold value, is taken as an example.

As shown in FIG. 14A, the third magnetic tunnel junction element MTJ(3) has been stacked on the first magnetic tunnel junction element MTJ(1).

The third magnetic tunnel junction element MTJ(3) has a third stacked body ST3 in which a third magnetization free layer 101(3), a third tunnel barrier layer 102(3) and a third magnetization fixed layer 103(3) are stacked in order. And, on a lower side of the third magnetization free layer 101(3), a third lower layer 104(3) is provided, and, on an upper side of the third magnetization fixed layer 103(3), a third upper electroconductive layer 105(3) is provided.

A stacking order of the third stacked body ST3 in the third magnetic tunnel junction element MTJ(3), and a stacking order of the first stacked body ST1 in the first magnetic tunnel junction element MTJ(1) are the same each other. In other words, the first stacked body ST1 has, from below upward, the first magnetization free layer 101(1), the first tunnel barrier layer 102(1) and the first magnetization fixed layer 103(1) stacked in this order, and the third stacked body ST3 also has these layers stacked in the same order.

As described above, a structure, in which the first stacked body ST1 and the third stacked body ST3 are stacked, is provided between the first lower metal 41(1) and the first upper metal 42(1).

The size of the outer shape of the first stacked body ST1 seen in the Z-axis direction and the size of the outer shape of the third stacked body ST3 seen in the Z-axis direction are set to be equal. Accordingly, in order to change the threshold values of the magnetization inversion of the first magnetic tunnel junction element MTJ(1) and the third magnetic tunnel junction element MTJ(3), there are a method of changing a material of a layer configuring the first stacked body ST1 and the third stacked body ST3, and a method of changing thickness of the magnetization free layer. By at least either one method of these, in the embodiment, the threshold value of the magnetization inversion of the third magnetic tunnel junction element MTJ(3) is set so as to be smaller than the threshold value of the magnetization inversion of the first magnetic tunnel junction element MTJ(1).

In such structure of the memory region 10, for example, along a direction of a current flowing from the first signal line BL(1) to the second signal line BL(2), the stacking order of the first stacked body ST1 and the stacking order of the third stacked body ST3 are the same each other. Accordingly, the state changes of the A state and the P state relative to the direction of the current are the same in the first magnetic tunnel junction element MTJ(1) and the third magnetic tunnel junction element MTJ(3). In addition to the property, the difference in the threshold values of the magnetization inversion are utilized to control the P state and the AP state of the first magnetic tunnel junction element MTJ(1) and the third magnetic tunnel junction element MTJ(3).

The fourth magnetic tunnel junction element MTJ(4) is provided between the second signal line BL(2) and the second magnetic tunnel junction element MTJ(2). In the fourth magnetic tunnel junction element MTJ(4), when a current not less than a fourth parallel threshold value, which is different from the second parallel threshold value, flows in the second direction d2, the magnetization direction becomes parallel, and when a current not less than a fourth antiparallel threshold value, which is different from the second antiparallel threshold value, flows in the first direction d1, the magnetization direction becomes antiparallel. The fourth parallel threshold value is smaller than, or larger than the second parallel threshold value. The fourth antiparallel threshold value is smaller than, or larger than the second antiparallel threshold value. In the embodiment, a case where the fourth parallel threshold value is smaller than the second parallel threshold value and the fourth antiparallel threshold value is smaller than the second antiparallel threshold value, shall be an example.

As shown in FIG. 14B, the fourth magnetic tunnel junction element MTJ(4) is stacked on the second magnetic tunnel junction element MTJ(2).

The fourth magnetic tunnel junction element MTJ(4) has a fourth stacked body ST4 in which the fourth magnetization free layer 101(4), the fourth tunnel barrier layer 102(4) and the fourth magnetization fixed layer 103(4) are stacked in this order. On the lower side of the fourth magnetization free layer 101(4), a fourth lower layer 104(4) is provided, and, on the upper side of the fourth magnetization fixed layer 103(4), a fourth upper electroconductive layer 105(4) is provided.

A stacking order of the fourth stacked body ST4 in the fourth magnetic tunnel junction element MTJ(4) and a stacking order of the second stacked body ST2 in the second magnetic tunnel junction element MTJ(2) are set to be the same each other. That is, the second stacked body ST2 is stacked, from below upward, in the order of the second magnetization free layer 101(2), the second tunnel barrier layer 102(2) and the second magnetization fixed layer 103(2), and the fourth stacked body ST4 is also stacked in the same order.

As described above, the structure, in which the second stacked body ST2 and the fourth stacked body ST4 are stacked, is provided between the second lower metal 41(2) and the second upper metal 42(2).

The size of the outer shape of the second stacked body ST2 seen in the Z-axis direction and the size of the outer shape of the fourth stacked body ST4 seen in the Z-axis direction are set to be equal. Accordingly, in order to change the threshold values of the magnetization inversion of the second magnetic tunnel junction element MTJ(2) and the fourth magnetic tunnel junction element MTJ(4), there are a method of changing a material of a layer configuring the second stacked body ST2 and the fourth stacked body ST4, and a method of changing thickness of the magnetization free layer. By at least any one method of these, the threshold value of the magnetization inversion of the fourth magnetic tunnel junction element MTJ(4) is set so as to be smaller than the threshold value of the magnetization inversion of the second magnetic tunnel junction element MTJ(2).

In such structure of the conductive region 20, even when the threshold value of the magnetization inversion of the first magnetic tunnel junction element MTJ(1) and the threshold value of the magnetization inversion of the third magnetic tunnel junction element MTJ(3) flows to the second magnetic tunnel junction element MTJ(2) and the fourth magnetic tunnel junction element MTJ(4), each of the magnetization directions of the second magnetic tunnel junction element MTJ(2) and the fourth magnetic tunnel junction element MTJ(4) is not inverted but is maintained in the P state.

Accordingly, the second magnetic tunnel junction element MTJ(2) and the fourth magnetic tunnel junction element MTJ(4) are kept in the state of low resistance, to function as the conductive region 20.

As described above, by using the structure, in which the first magnetic tunnel junction element MTJ(1) and the third magnetic tunnel junction element MTJ(3) are stacked on the memory region 10 and the second magnetic tunnel junction element MTJ(2) and the fourth magnetic tunnel junction element MTJ(4) are stacked on the conductive region 20, in the memory device 130, a configuration storing 2-bit information can be realized.

Meanwhile, in the memory device 130 shown in FIG. 13, a configuration, in which the magnetic tunnel junction elements are stacked, is adopted for either of the memory region 10 and the conductive region 20, but one, in which a structure of stacking the magnetic tunnel junction elements is adopted in only one of either the memory region 10 or the conductive region 20, may also be acceptable. And, in each of the memory region 10 and the conductive region 20, the number of magnetic tunnel junction elements to be stacked may be not less than three.

Next, the operation of the memory device 130 according to the embodiment is explained.

Figure 15:
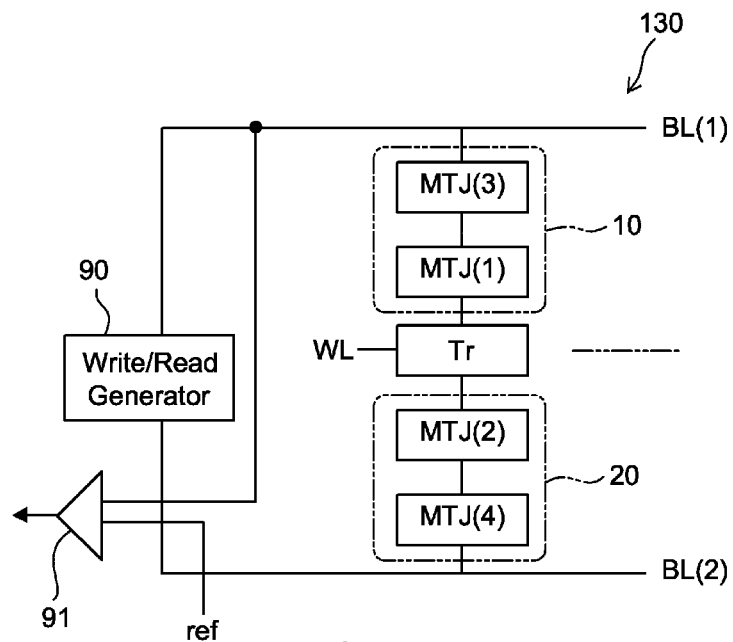
FIG. 15 is a block diagram illustrating the memory device and the peripheral circuit thereof.

FIG. 15 is a block diagram illustrating the memory device and the peripheral circuit thereof.

FIG. 16A to 16D are schematic cross-sectional views for explaining a specific writing operation.

FIG. 16 shows schematically the first magnetic tunnel junction element MTJ(1) to the fourth magnetic tunnel junction element MTJ(4), directions of currents, and the A state and AP state, in the memory device 130.

As shown in FIG. 15, as peripheral circuits of the memory device 130, the signal generator 90 and the sense amplifier 91 are provided. In the memory region 10 provided between the transistor Tr and the first signal line BL(1), the first magnetic tunnel junction element MTJ(1) is provided on the transistor Tr side, and the third magnetic tunnel junction element MTJ(3) is provided on the first signal line BL(1) side. In the conductive region 20 provided between the transistor Tr and the second signal line BL(2), the second magnetic tunnel junction element MTJ(2) is provided on the transistor Tr side, and the fourth magnetic tunnel junction element MTJ(4) is provided on the second signal line BL(2) side.

Next, a specific example of a writing operation of information is explained.

When performing writing of information, the signal generator 90 applies a voltage, as a write voltage, for making any of the currents i1A, i1P, i3A and i3P to flow between the first signal line BL(1) and the second signal line BL(2).

Here, the current i3A is a current for bringing the third magnetic tunnel junction element MTJ(3) into the AP state. The current i3A has a value not less than the third antiparallel threshold value and less than the first antiparallel threshold value.

The current i3P is a current for bringing the third magnetic tunnel junction element MTJ(3) into the P state. The current i3P has a value not less than the third parallel threshold value and less than the first parallel threshold value.

Meanwhile, prior to writing information, the second magnetic tunnel junction element MTJ(2) and the fourth magnetic tunnel junction element MTJ(4) are in the P state, that is, in the state of low resistance.

Moreover, even when any of the currents i1A, i1P, i3A and i3P are flown, the magnetization inversion does not occur in any of the second magnetic tunnel junction element MTJ(2) and the fourth magnetic tunnel junction element MTJ(4), and they are maintained as the P state.

Figure 16A:
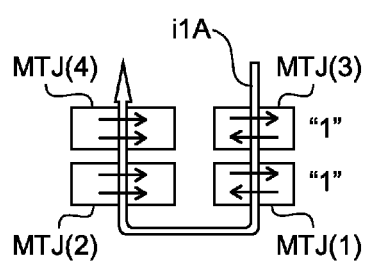
FIG. 16A to 16D are schematic cross-sectional views for explaining a specific writing operation.

FIG. 16A illustrates an operation when the current i1A is flown. That is, the operation when the control line WL of the transistor Tr shown in FIG. 15 is selected, and the current i1A is flown from the first signal line BL(1) to the second signal line BL(2).

Both the first magnetic tunnel junction element MTJ(1) and the third magnetic tunnel junction element MTJ(3) are put in the AP state as the result of the flow of the current i1A.

In the second magnetic tunnel junction element MTJ(2) and the fourth magnetic tunnel junction element MTJ(4), the P state is maintained even when the current i1A flows, and they function as the conductive region 20.

In the embodiment, the AP state shall be a bit "1," and the P state shall be a bit "0." Moreover, as an example, 2-bit information shall be shown in the order of the first magnetic tunnel junction element MTJ(1), and the third magnetic tunnel junction element MTJ(3).

Accordingly, in the operation shown in FIG. 16A, "11" based on 2 bits is to be stored.

Figure 16B:
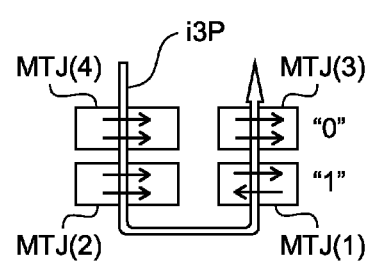

FIG. 16B illustrates an operation when the current i3P is flown, after having been put in the state shown in FIG. 16A. In other words, the operation when the control line WL of the transistor Tr shown in FIG. 15 is selected, and the current i3P is flown from the second signal line BL(2) to the first signal line BL(1).

When the current i3P flows, only the third magnetic tunnel junction element MTJ(3) is put in the P state, and the states of other magnetic tunnel junction elements MTJ(1), MTJ(2) and MTJ(4) are not inverted but are maintained. The second magnetic tunnel junction element MTJ(2) and the fourth magnetic tunnel junction element MTJ(4) function as the conductive region 20.

Accordingly, in the operation illustrated in FIG. 16B, "10" based on 2 bits is to be stored.

Figure 16C:
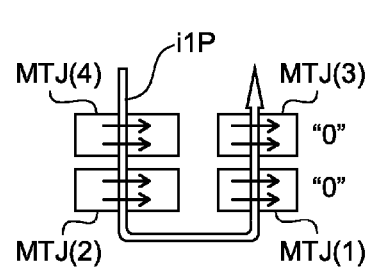

FIG. 16C illustrates an operation when the current i1P is flown. In other words, the operation when the control line WL of the transistor Tr shown in FIG. 15 is selected, and the current i1P is flown from the second signal line BL(2) to the first signal line BL(1).

As the result of the flow of the current i1P, both the first magnetic tunnel junction element MTJ(1) and the third magnetic tunnel junction element MTJ(3) are put in the P state.

The second magnetic tunnel junction element MTJ(2) and the fourth magnetic tunnel junction element MTJ(4) are maintained in the P state even when the current i1P flows, to function as the conductive region 20.

Accordingly, in the operation illustrated in FIG. 16C, "00" based on 2 bits is to be stored.

Figure 16D:
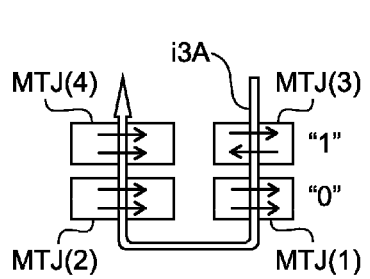

FIG. 16D illustrates an operation when the current i3A is flown, after having been put in the state shown in FIG. 16C. In other words, the control line WL of the transistor Tr shown in FIG. 15 is selected, and the current i3A is flown from the first signal line BL(1) to the second signal line BL(2).

When the current i3A flows, only the third magnetic tunnel junction element MTJ(3) is put in the AP state, and the states of the other magnetic tunnel junction elements MTJ(1), MTJ(2) and MTJ(4) are not inverted but are maintained. The second magnetic tunnel junction element MTJ(2) and the fourth magnetic tunnel junction element MTJ(4) function as the conductive region 20.

Accordingly, in the operation illustrated in FIG. 16D, "01" based on 2 bits is to be stored.

Here, the writing operations are summarized.

When "00" is to be stored, the current i1P is flown.

When "01" is to be stored, the current i1P is flown and, after that, the current i3A is flown.

When "10" is to be stored, the current i1A is flown and, after that, the current i3P is flown.

When "11" is to be stored, the current i1A is flown.

Next, specific examples of reading operations are explained.

When performing the reading of information, the signal generator 90 applies, as the read-out voltage, a read-out voltage between the first signal line BL(1) and the second signal line BL(2). The read-out voltage is smaller than the smallest write voltage.

In the memory device 130, the total resistance value changes depending on combinations of the AP state and the P state of the first magnetic tunnel junction element MTJ(1) and the third magnetic tunnel junction element MTJ(3). As the result, the difference between the first signal line BL(1) and the reference voltage ref changes, to make it possible to discriminate the stored information.

Here, an example of the value of resistance according to the AP state and the P state of the first magnetic tunnel junction element MTJ(1) and the third magnetic tunnel junction element MTJ(3) is shown.

When the first magnetic tunnel junction element MTJ(1) is in the AP state, the resistance value is, for example, 7 kilo ohms (kΩ). When the third magnetic tunnel junction element MTJ(3) is in the AP state, the resistance value is, for example, 3 kΩ. When setting the MR ratio (the magnetoresistive ratio) of the first magnetic tunnel junction element MTJ(1) and the third magnetic tunnel junction element MTJ(3), for example, to be 200 percents (%), the total values of resistance according to combinations of the AP state and the P state of the first magnetic tunnel junction element MTJ(1) and the third magnetic tunnel junction element MTJ(3) are as follows.

In the case of "00," the total resistance value is 10 kΩ (parasitic resistance).

In the case of "10," the total resistance value is 16 kΩ.

In the case of "01," the total resistance value is 24 kΩ.

In the case of "11," the total resistance value is 30 kΩ.

The output of the sense amplifier 91 changes in accordance with the above-mentioned total resistance value. Accordingly, in accordance with the output of the sense amplifier 91, the stored information can be determined. Meanwhile, in the embodiment, between the resistance value in the AP state of the first magnetic tunnel junction element MTJ(1) and the resistance value in the AP state of the third magnetic tunnel junction element MTJ(3), a difference is provided. Consequently, a difference occurs in the total values of resistance between the case of "10" and the case of "01," and it becomes possible to discriminate these by the output of the sense amplifier 91.

As described above, the semiconductor memory device 130 can comply with multi-valuing by the first magnetic tunnel junction element MTJ(1) and the third magnetic tunnel junction element MTJ(3). Moreover, in either of the writing operation and the reading operation, the second magnetic tunnel junction element MTJ(2) and the fourth magnetic tunnel junction element MTJ(4) serve as the conductive region 20. In the embodiment, since the memory region 10 and the conductive region 20 are set to have the same layer structure, provision of a separated conductive part (such as a via) is unnecessary between the transistor Tr and the second signal line BL(2), to make it possible to simplify the manufacturing process.

As described above, according to the memory device and the method for manufacturing the same according to the embodiments, in realizing a structure complying with multi-valuing using the magnetic tunnel junction element, the simplification of the layer structure and the manufacturing process can be achieve.

Meanwhile, hereinabove, the embodiments and modified examples thereof are described, but the invention is not restricted to these examples. For example, for the first magnetic tunnel junction element MTJ(1) and the third magnetic tunnel junction element MTJ(3), the P state is defined as bit "0," and the AP state is defined as bit "1," but the inverse is also acceptable. And, for the first magnetic tunnel junction element MTJ(1) and the third magnetic tunnel junction element MTJ(3), the resistance value in the AP state is an example, and is not restricted to this. Moreover, one skilled in the art may perform addition, deletion or design change of a constituent component for above-described respective embodiments or modified examples thereof, or may combine suitably characteristics of respective embodiments, and they are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
    a first signal line;
    a second signal line;
    a transistor configured to control a conduction of each of a current in a first direction flowing between the first signal line and the second signal line and a current in a second direction opposite to the first direction;
    a memory region having a first magnetic tunnel junction element which is connected between the first signal line and one end of the transistor, a magnetization direction of which becomes parallel when a current not less than a first parallel threshold value flows in the first direction, and the magnetization direction of which becomes antiparallel when a current not less than a first antiparallel threshold value flows in the second direction; and
    a conductive region connected between the second signal line and the other end of the transistor.

2. The device according to claim 1 wherein the conductive region includes a second magnetic tunnel junction element which contains a ferromagnetic material, and a magnetization direction of which is maintained when any of a current not less than the first parallel threshold value and a current not less than the first antiparallel threshold value flows.

3. The device according to claim 2 wherein, in the second magnetic tunnel junction element, the magnetization direction becomes parallel when a current not less than a second parallel threshold value larger than the first parallel threshold value flows in the second direction, and the magnetization direction becomes antiparallel when a current not less than a second antiparallel threshold value larger than the first antiparallel threshold value flows in the first direction.

4. The device according to claim 2 wherein:
the first magnetic tunnel junction element has a first stacked body, wherein a first lower ferromagnetic material layer, a first tunnel barrier layer and a first upper ferromagnetic material layer are stacked in this order; and
the second magnetic tunnel junction element has a second stacked body, wherein a second lower ferromagnetic material layer, a second tunnel barrier layer and a second upper ferromagnetic material layer are stacked in this order.

5. The device according to claim 4 wherein:
the first lower ferromagnetic material layer and the second lower ferromagnetic material layer are provided in a same thickness on a same plane;
the first tunnel barrier layer and the second tunnel barrier layer are provided in a same thickness on a same plane; and
the first upper ferromagnetic material layer and the second upper ferromagnetic material layer are provided in a same thickness on a same plane.

6. The device according to claim 4 wherein a volume of the first lower ferromagnetic body layer is smaller than a volume of the second lower ferromagnetic body layer.

7. The device according to claim 1 wherein the conductive region has a same layer structure as a layer structure of at least a part of the first magnetic tunnel junction element.

8. The device according to claim 1 wherein the conductive region includes a third magnetic tunnel junction element which is provided between the first signal line and the first magnetic tunnel junction element, a magnetization direction of which becomes parallel when a current not less than a third parallel threshold value different from the first parallel threshold value flows in the first direction, and the magnetization direction of which becomes antiparallel when a current not less than a third antiparallel threshold value different from the first antiparallel threshold value flows in the second direction.

9. The device according to claim 8 wherein the conductive region includes a stacked body which is provided between the second signal line and the second magnetic tunnel junction element and has a same layer structure as a layer structure of at least a part of the third magnetic tunnel junction element.

10. The device according to claim 1 further comprising a plurality of the memory regions and a plurality of the conductive regions, wherein;
the plurality of memory regions are disposed in a row direction and in a column direction a same pitch, respectively;
the plurality of conductive regions are disposed in the row direction and in the column direction at the same pitch, respectively; and
the plurality of memory regions and the plurality of conductive regions are disposed with a half pitch offset to each other in the row direction and in the column direction.

11. The device according to claim 10 further comprising:
a plurality of the transistors provided at a first pitch in each of the row direction and the column direction;
a plurality of the first signal lines and a plurality of the second signal lines extending in one of the row direction and the column direction and alternately disposed one by one at a second pitch half the first pitch; and
a plurality of control lines extending in the other of the row direction and the column direction and disposed at the first pitch, wherein
the memory region and the conductive region are formed in each of the plurality of transistors.

12. The device according to claim 4 wherein the first lower ferromagnetic material layer is a magnetization free layer, and the first upper ferromagnetic material layer is a magnetization fixed layer.

* * * * *